(12) United States Patent
Park et al.

(10) Patent No.: US 8,882,922 B2
(45) Date of Patent: Nov. 11, 2014

(54) ORGANIC LAYER DEPOSITION APPARATUS

(75) Inventors: Hyun-Sook Park, Yongin (KR); Chang-Mog Jo, Yongin (KR); Yun-Mi Lee, Yongin (KR); Seok-Rak Chang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 640 days.

(21) Appl. No.: 13/244,391

(22) Filed: Sep. 24, 2011

(65) Prior Publication Data

US 2012/0103253 A1 May 3, 2012

(30) Foreign Application Priority Data

Nov. 1, 2010 (KR) ........................ 10-2010-0107712

(51) Int. Cl.
| | | |
|---|---|---|
| *C23C 16/00* | (2006.01) | |
| *C23C 14/04* | (2006.01) | |
| *H01L 21/67* | (2006.01) | |
| *C23C 14/12* | (2006.01) | |
| *H01L 51/00* | (2006.01) | |
| *B05D 1/00* | (2006.01) | |

(52) U.S. Cl.
CPC ........ *H01L 21/67173* (2013.01); *C23C 14/042* (2013.01); *H01L 21/67207* (2013.01); *C23C 14/12* (2013.01); *B05D 1/60* (2013.01); *H01L 51/0005* (2013.01)
USPC .......................................... 118/726; 118/727

(58) Field of Classification Search
CPC ..................... H01L 21/67173; H01L 51/0005; H01L 21/67207; C23C 14/12; C23C 14/042; C23C 14/044; B05D 1/60
USPC ......................................................... 118/726
See application file for complete search history.

(56) References Cited

U.S. PATENT DOCUMENTS

| | | | |
|---|---|---|---|
| 4,416,217 A | 11/1983 | Nakamura et al. | |
| 4,468,648 A | 8/1984 | Uchikune | |
| 4,687,939 A | 8/1987 | Miyauchi et al. | |
| 4,792,378 A | 12/1988 | Rose et al. | |
| 4,901,667 A | 2/1990 | Suzuki et al. | |
| 5,454,847 A | 10/1995 | Jacoboni et al. | |
| 5,460,654 A | 10/1995 | Kikkawa et al. | |
| 5,487,609 A | 1/1996 | Asada | |
| 5,742,129 A | 4/1998 | Nagayama et al. | |
| 5,909,995 A | 6/1999 | Wolf et al. | |

(Continued)

FOREIGN PATENT DOCUMENTS

| | | |
|---|---|---|
| CN | 1476279 A | 2/2004 |
| CN | 1489419 A | 4/2004 |

(Continued)

OTHER PUBLICATIONS

KIPO Registration Determination Certificate dated Jul. 20, 2012, for Korean priority Patent application 10-2010-0003545, (5 pages).

(Continued)

*Primary Examiner* — Keath Chen

(74) *Attorney, Agent, or Firm* — Christie, Parker & Hale, LLP

(57) ABSTRACT

An organic layer deposition apparatus capable of reducing or minimizing shifting of a pattern, caused when a patterning slit sheet sags.

23 Claims, 12 Drawing Sheets

(56) References Cited

U.S. PATENT DOCUMENTS

| | | | |
|---|---|---|---|
| 6,045,671 A | 4/2000 | Wu et al. |
| 6,091,195 A | 7/2000 | Forrest et al. |
| 6,099,649 A | 8/2000 | Schmitt et al. |
| 6,274,198 B1 | 8/2001 | Dautartas |
| 6,280,821 B1 | 8/2001 | Kadunce et al. |
| 6,371,451 B1 | 4/2002 | Choi |
| 6,417,034 B2 | 7/2002 | Kitazume et al. |
| 6,443,597 B1 | 9/2002 | Natori |
| 6,483,690 B1 | 11/2002 | Nakajima et al. |
| 6,541,130 B2 | 4/2003 | Fukuda |
| 6,554,969 B1 | 4/2003 | Chong |
| 6,579,422 B1 | 6/2003 | Kakinuma |
| 6,589,673 B1 | 7/2003 | Kido et al. |
| 6,650,023 B2 | 11/2003 | Kim |
| 6,699,324 B1 | 3/2004 | Berdin et al. |
| 6,749,906 B2 | 6/2004 | Van Slyke |
| 6,776,847 B2 | 8/2004 | Yamazaki et al. |
| 6,837,939 B1 | 1/2005 | Klug et al. |
| 6,878,209 B2 | 4/2005 | Himeshima et al. |
| 6,946,783 B2 | 9/2005 | Kim |
| 6,955,726 B2 * | 10/2005 | Kang et al. ............... 118/720 |
| 6,995,035 B2 | 2/2006 | Cok et al. |
| 7,006,202 B2 | 2/2006 | Byun et al. |
| RE39,024 E | 3/2006 | Takahashi |
| 7,078,070 B2 | 7/2006 | Peng |
| 7,199,520 B2 | 4/2007 | Fujii et al. |
| 7,282,855 B2 | 10/2007 | Park et al. |
| 7,322,248 B1 | 1/2008 | Long et al. |
| 7,495,389 B2 | 2/2009 | Noguchi et al. |
| 7,601,439 B2 | 10/2009 | Chun et al. |
| 7,776,457 B2 | 8/2010 | Lee et al. |
| 7,872,256 B2 | 1/2011 | Sung et al. |
| 7,910,386 B2 | 3/2011 | Shiang et al. |
| 7,964,037 B2 | 6/2011 | Fukuda et al. |
| 8,022,448 B1 | 9/2011 | Luu et al. |
| 8,128,753 B2 | 3/2012 | Bulovic et al. |
| 8,137,466 B2 | 3/2012 | Kang et al. |
| 8,188,476 B2 | 5/2012 | Takagi et al. |
| 8,193,011 B2 | 6/2012 | Kang et al. |
| 8,673,077 B2 | 3/2014 | Sonoda et al. |
| 2001/0004186 A1 | 6/2001 | Song et al. |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2001/0034175 A1 | 10/2001 | Miyazaki et al. |
| 2002/0011785 A1 | 1/2002 | Tang et al. |
| 2002/0017245 A1 | 2/2002 | Tsubaki et al. |
| 2002/0033136 A1 | 3/2002 | Savage et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0179013 A1 | 12/2002 | Kido et al. |
| 2002/0187253 A1 | 12/2002 | Marcus et al. |
| 2002/0194727 A1 | 12/2002 | Cho et al. |
| 2002/0197393 A1 | 12/2002 | Kuwabara |
| 2003/0021886 A1 | 1/2003 | Baele |
| 2003/0101932 A1 | 6/2003 | Kang |
| 2003/0101937 A1 | 6/2003 | Van Slyke et al. |
| 2003/0117602 A1 | 6/2003 | Kobayashi et al. |
| 2003/0118950 A1 | 6/2003 | Chao et al. |
| 2003/0124764 A1 | 7/2003 | Yamazaki et al. |
| 2003/0151637 A1 | 8/2003 | Nakamura et al. |
| 2003/0164934 A1 | 9/2003 | Nishi et al. |
| 2003/0168013 A1 | 9/2003 | Freeman et al. |
| 2003/0173896 A1 | 9/2003 | Grushin et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0016907 A1 | 1/2004 | Shi |
| 2004/0029028 A1 | 2/2004 | Shimizu |
| 2004/0056244 A1 | 3/2004 | Marcus et al. |
| 2004/0086639 A1 | 5/2004 | Grantham et al. |
| 2004/0096771 A1 | 5/2004 | Kashiwagi et al. |
| 2004/0115338 A1 | 6/2004 | Yoneda |
| 2004/0115342 A1 | 6/2004 | Shigemura |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0157167 A1 | 8/2004 | Morii |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2004/0263547 A1 | 12/2004 | Sugahara |
| 2004/0263771 A1 | 12/2004 | Jeong et al. |
| 2005/0001546 A1 | 1/2005 | Yamaguchi |
| 2005/0016461 A1 | 1/2005 | Klug et al. |
| 2005/0031836 A1 | 2/2005 | Hira |
| 2005/0037136 A1 | 2/2005 | Yamamoto |
| 2005/0039684 A1 | 2/2005 | Yi et al. |
| 2005/0072359 A1 | 4/2005 | Kim |
| 2005/0072361 A1 | 4/2005 | Yang et al. |
| 2005/0079418 A1 | 4/2005 | Kelley et al. |
| 2005/0110400 A1 | 5/2005 | Nakamura |
| 2005/0118788 A1 | 6/2005 | Kuwahara et al. |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0186330 A1 | 8/2005 | Kim et al. |
| 2005/0213021 A1 | 9/2005 | Myoung |
| 2005/0217584 A1 | 10/2005 | Abiko et al. |
| 2005/0229848 A1 | 10/2005 | Shinriki et al. |
| 2005/0244580 A1 | 11/2005 | Cok et al. |
| 2005/0263074 A1 | 12/2005 | Masuda et al. |
| 2006/0011136 A1 | 1/2006 | Yamazaki et al. |
| 2006/0012771 A1 | 1/2006 | Jeong |
| 2006/0022590 A1 | 2/2006 | Aziz et al. |
| 2006/0040132 A1 | 2/2006 | Liao et al. |
| 2006/0045958 A1 | 3/2006 | Abiko et al. |
| 2006/0066231 A1 | 3/2006 | Nishikawa et al. |
| 2006/0090705 A1 | 5/2006 | Kim |
| 2006/0102078 A1 | 5/2006 | Fairbairn et al. |
| 2006/0110544 A1 | 5/2006 | Kim et al. |
| 2006/0113907 A1 | 6/2006 | Im et al. |
| 2006/0115585 A1 | 6/2006 | Bulovic et al. |
| 2006/0130766 A1 | 6/2006 | Kim et al. |
| 2006/0144325 A1 | 7/2006 | Jung et al. |
| 2006/0152641 A1 | 7/2006 | Brody |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0267294 A1 | 11/2006 | Busse et al. |
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigan et al. |
| 2007/0009552 A1 | 1/2007 | Whitehead et al. |
| 2007/0009652 A1 | 1/2007 | Manz et al. |
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0075955 A1 | 4/2007 | Jung et al. |
| 2007/0077358 A1 | 4/2007 | Jeong et al. |
| 2007/0148337 A1 | 6/2007 | Nichols et al. |
| 2007/0148348 A1 | 6/2007 | Huh et al. |
| 2007/0157879 A1 | 7/2007 | Yotsuya |
| 2007/0158471 A1 | 7/2007 | Park et al. |
| 2007/0163497 A1 | 7/2007 | Grace et al. |
| 2007/0178708 A1 | 8/2007 | Ukigaya |
| 2007/0190235 A1 | 8/2007 | Yamazaki et al. |
| 2007/0195844 A1 | 8/2007 | Ma et al. |
| 2007/0231460 A1 | 10/2007 | Ukigaya |

(56) References Cited

U.S. PATENT DOCUMENTS

| | | |
|---|---|---|
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0038935 A1 | 2/2008 | Baude et al. |
| 2008/0057183 A1 | 3/2008 | Spindler et al. |
| 2008/0100204 A1 | 5/2008 | Kim |
| 2008/0115729 A1 | 5/2008 | Oda et al. |
| 2008/0118743 A1 | 5/2008 | Lee et al. |
| 2008/0126741 A1 | 5/2008 | Triplett |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0202421 A1 | 8/2008 | Allen et al. |
| 2008/0238294 A1 | 10/2008 | Xu et al. |
| 2008/0251785 A1 | 10/2008 | Noh et al. |
| 2008/0286461 A1 | 11/2008 | Noguchi et al. |
| 2008/0290791 A1 | 11/2008 | Lee et al. |
| 2008/0298947 A1 | 12/2008 | Yeo et al. |
| 2008/0309718 A1 | 12/2008 | Oya et al. |
| 2009/0001882 A1 | 1/2009 | Park et al. |
| 2009/0014412 A1 | 1/2009 | Nozawa et al. |
| 2009/0017192 A1 | 1/2009 | Matsuura |
| 2009/0027767 A1 | 1/2009 | Souriau et al. |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0170230 A1 | 7/2009 | Kidu et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0269881 A1 | 10/2009 | Furuta et al. |
| 2009/0277386 A1 | 11/2009 | Takagi et al. |
| 2009/0279173 A1 | 11/2009 | Chui et al. |
| 2009/0302750 A1 | 12/2009 | Jun et al. |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0089443 A1 | 4/2010 | Bloomstein et al. |
| 2010/0090594 A1 | 4/2010 | Choi et al. |
| 2010/0130020 A1 | 5/2010 | Kim et al. |
| 2010/0156279 A1 | 6/2010 | Tamura et al. |
| 2010/0165454 A1 | 7/2010 | Suetsugu et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0248416 A1 | 9/2010 | Priddy et al. |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0068331 A1 | 3/2011 | Koh et al. |
| 2011/0123707 A1 | 5/2011 | Lee et al. |
| 2011/0139069 A1 | 6/2011 | Ahn et al. |
| 2011/0165327 A1 | 7/2011 | Park et al. |
| 2011/0168986 A1 | 7/2011 | Lee et al. |
| 2011/0220019 A1 | 9/2011 | Lee et al. |
| 2011/0220022 A1 | 9/2011 | Hong et al. |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0006259 A1 | 1/2012 | Sung et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0028390 A1 | 2/2012 | Lee et al. |
| 2012/0068199 A1 | 3/2012 | Sung et al. |
| 2012/0068201 A1 | 3/2012 | Sung et al. |
| 2012/0070928 A1 | 3/2012 | Kim et al. |
| 2012/0083061 A1 | 4/2012 | Kang et al. |
| 2012/0097992 A1 | 4/2012 | Jeong |
| 2012/0100282 A1 | 4/2012 | Lee et al. |
| 2012/0103253 A1 | 5/2012 | Park et al. |
| 2012/0132137 A1 | 5/2012 | Oh et al. |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0183676 A1 | 7/2012 | Sonoda et al. |
| 2012/0214263 A1 | 8/2012 | Yamazaki et al. |
| 2012/0299016 A1 | 11/2012 | Choi |
| 2012/0299023 A1 | 11/2012 | Lee et al. |
| 2012/0299024 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2013/0001528 A1 | 1/2013 | Chang et al. |
| 2013/0008379 A1 | 1/2013 | Chang et al. |
| 2013/0032829 A1 | 2/2013 | Sung et al. |
| 2013/0157016 A1 | 6/2013 | Kim |
| 2013/0217164 A1 | 8/2013 | Kang et al. |
| 2013/0291796 A1 | 11/2013 | Inoue et al. |
| 2013/0298829 A1 | 11/2013 | Jo et al. |
| 2013/0341598 A1 | 12/2013 | Chang et al. |
| 2014/0010957 A1 | 1/2014 | Inoue et al. |
| 2014/0014917 A1 | 1/2014 | Lee et al. |
| 2014/0014918 A1 | 1/2014 | Han |
| 2014/0014920 A1 | 1/2014 | Lee |
| 2014/0014921 A1 | 1/2014 | Choi |
| 2014/0014924 A1 | 1/2014 | Oh et al. |
| 2014/0014929 A1 | 1/2014 | Lee et al. |
| 2014/0034917 A1 | 2/2014 | Lee et al. |
| 2014/0045343 A1 | 2/2014 | Choi et al. |
| 2014/0077168 A1 | 3/2014 | Kim |
| 2014/0084262 A1 | 3/2014 | Kim |
| 2014/0084263 A1 | 3/2014 | Jin et al. |
| 2014/0110680 A1 | 4/2014 | Choe |
| 2014/0131667 A1 | 5/2014 | Chang |

FOREIGN PATENT DOCUMENTS

| | | |
|---|---|---|
| CN | 1500904 A | 6/2004 |
| CN | 1556872 A | 12/2004 |
| CN | 1607868 A | 4/2005 |
| CN | 1682569 A | 10/2005 |
| CN | 1704501 A | 12/2005 |
| CN | 1814854 A | 8/2006 |
| CN | 1841696 A | 10/2006 |
| EP | 1 413 644 A2 | 4/2004 |
| EP | 1 418 250 A2 | 5/2004 |
| EP | 1 518 940 A1 | 3/2005 |
| EP | 2354270 A1 | 8/2011 |
| JP | 57-194252 A2 | 11/1982 |
| JP | 2-247372 | 10/1990 |
| JP | 04-272170 | 9/1992 |
| JP | 5-22405 U1 | 3/1993 |
| JP | 5-98425 A2 | 4/1993 |
| JP | 5-230628 A2 | 9/1993 |
| JP | 8-27568 A2 | 1/1996 |
| JP | 9-95776 A2 | 4/1997 |
| JP | 10-50478 | 2/1998 |
| JP | 10-120171 | 5/1998 |

(56) References Cited

FOREIGN PATENT DOCUMENTS

| | | |
|---|---|---|
| JP | 10-270535 | 10/1998 |
| JP | 11-144865 | 5/1999 |
| JP | 2000-068054 | 3/2000 |
| JP | 2000-282219 | 10/2000 |
| JP | 2000-323277 | 11/2000 |
| JP | 2001-28325 A2 | 1/2001 |
| JP | 2001-052862 | 2/2001 |
| JP | 2001-093667 | 4/2001 |
| JP | 2002-075638 | 3/2002 |
| JP | 2002-175878 | 6/2002 |
| JP | 2002-348659 A2 | 12/2002 |
| JP | 2003-003250 | 1/2003 |
| JP | 2003-077662 | 3/2003 |
| JP | 2003-157973 | 5/2003 |
| JP | 2003-197531 A2 | 7/2003 |
| JP | 2003-297562 | 10/2003 |
| JP | 2003-321767 | 11/2003 |
| JP | 2003-347394 A2 | 12/2003 |
| JP | 2004-035964 A2 | 2/2004 |
| JP | 2004-043898 | 2/2004 |
| JP | 2004-76150 A2 | 3/2004 |
| JP | 2004-91858 A2 | 3/2004 |
| JP | 2004-103269 | 4/2004 |
| JP | 2004-103341 | 4/2004 |
| JP | 2004-107764 A2 | 4/2004 |
| JP | 2004-137583 A2 | 5/2004 |
| JP | 2004-143521 A2 | 5/2004 |
| JP | 2004-169169 | 6/2004 |
| JP | 2004-199919 | 7/2004 |
| JP | 2004-225058 | 8/2004 |
| JP | 2004-342455 A2 | 12/2004 |
| JP | 2004-349101 | 12/2004 |
| JP | 2004-355975 | 12/2004 |
| JP | 2005-044592 | 2/2005 |
| JP | 2005-101505 | 4/2005 |
| JP | 2005-122980 | 5/2005 |
| JP | 2005-163099 | 6/2005 |
| JP | 2005-165015 A2 | 6/2005 |
| JP | 2005-174843 | 6/2005 |
| JP | 2005-206939 A2 | 8/2005 |
| JP | 2005-213616 A2 | 8/2005 |
| JP | 2005-235568 | 9/2005 |
| JP | 2005-293968 | 10/2005 |
| JP | 2005-296737 | 10/2005 |
| JP | 2006-28583 A2 | 2/2006 |
| JP | 2006-172930 A2 | 6/2006 |
| JP | 2006-176809 A2 | 7/2006 |
| JP | 2006-210038 | 8/2006 |
| JP | 2006-219760 | 8/2006 |
| JP | 2006-275433 | 10/2006 |
| JP | 2006-292955 A2 | 10/2006 |
| JP | 2006-307247 A2 | 11/2006 |
| JP | 2007-047293 | 2/2007 |
| JP | 2007-66862 | 3/2007 |
| JP | 2007-146219 | 6/2007 |
| JP | 2007-157886 | 6/2007 |
| JP | 2007-186740 | 7/2007 |
| JP | 2007-242436 | 9/2007 |
| JP | 2007-291506 A2 | 11/2007 |
| JP | 2008-19477 A2 | 1/2008 |
| JP | 2008-108628 | 5/2008 |
| JP | 2008-121098 | 5/2008 |
| JP | 2008-521165 | 6/2008 |
| JP | 2008-156686 | 7/2008 |
| JP | 2008-196003 | 8/2008 |
| JP | 2008-248301 A2 | 10/2008 |
| JP | 2008-274373 | 11/2008 |
| JP | 2008-300056 | 12/2008 |
| JP | 2009-019243 | 1/2009 |
| JP | 2009-24208 A2 | 2/2009 |
| JP | 2009-049223 | 3/2009 |
| JP | 2009-81165 A2 | 4/2009 |
| JP | 2009-87910 | 4/2009 |
| JP | 2009-117231 A2 | 5/2009 |
| JP | 2010-159167 A2 | 7/2010 |
| JP | 2010-261081 A2 | 11/2010 |
| JP | 2011-47035 | 3/2011 |
| JP | 2011-146377 | 7/2011 |
| JP | 2012-92448 | 5/2012 |
| JP | 2012-211352 | 11/2012 |
| KR | 1997-0008709 A | 2/1997 |
| KR | 10-0257219 B1 | 2/2000 |
| KR | 10-2000-0019254 | 4/2000 |
| KR | 10-2000-0023929 | 5/2000 |
| KR | 10-2001-0024652 | 3/2001 |
| KR | 2001-0030175 A | 4/2001 |
| KR | 10-2001-0039298 A | 5/2001 |
| KR | 10-2001-0059939 | 7/2001 |
| KR | 10-2001-0092914 A | 10/2001 |
| KR | 2001-0093666 A | 10/2001 |
| KR | 20-0257218 | 11/2001 |
| KR | 10-2002-0000201 | 1/2002 |
| KR | 10-2002-0001555 | 1/2002 |
| KR | 2002-0025760 | 4/2002 |
| KR | 10-2002-0050922 | 6/2002 |
| KR | 10-2002-0090934 | 12/2002 |
| KR | 10-2002-0091457 A | 12/2002 |
| KR | 10-2003-0001745 A | 1/2003 |
| KR | 2003-0034730 A | 5/2003 |
| KR | 10-2003-0043012 A | 6/2003 |
| KR | 10-2003-0046090 | 6/2003 |
| KR | 2003-0069684 | 8/2003 |
| KR | 10-0405080 B1 | 11/2003 |
| KR | 10-0406059 B1 | 11/2003 |
| KR | 10-2003-0091947 | 12/2003 |
| KR | 10-2003-0093959 | 12/2003 |
| KR | 10-2008-0109559 A | 12/2003 |
| KR | 2003-0094033 A | 12/2003 |
| KR | 10-2004-0014258 A | 2/2004 |
| KR | 20-0342433 Y1 | 2/2004 |
| KR | 10-2004-0034537 | 4/2004 |
| KR | 10-2004-0039910 A | 5/2004 |
| KR | 10-0430336 B1 | 5/2004 |
| KR | 10-2004-0050045 | 6/2004 |
| KR | 10-2004-0069281 | 8/2004 |
| KR | 10-2004-0084747 | 10/2004 |
| KR | 10-2004-0087142 A | 10/2004 |
| KR | 10-2004-0110718 A | 12/2004 |
| KR | 10-0463212 B1 | 12/2004 |
| KR | 10-2005-0018234 A | 2/2005 |
| KR | 10-2005-0024324 A | 3/2005 |
| KR | 10-2005-0028943 | 3/2005 |
| KR | 10-2005-0039140 A | 4/2005 |
| KR | 10-0483487 B1 | 4/2005 |
| KR | 10-2005-0062853 | 6/2005 |
| KR | 10-2005-0082644 A | 8/2005 |
| KR | 10-0520159 B1 | 10/2005 |
| KR | 10-0532657 B1 | 12/2005 |
| KR | 10-2006-0008602 | 1/2006 |
| KR | 10-2006-0018745 | 3/2006 |
| KR | 2006-0020050 | 3/2006 |
| KR | 10-2006-0045225 A | 5/2006 |
| KR | 10-2006-0051746 A | 5/2006 |
| KR | 10-2006-0053926 A | 5/2006 |
| KR | 10-2006-0056706 A | 5/2006 |
| KR | 10-2006-0058459 A | 5/2006 |
| KR | 10-2006-0059323 A | 6/2006 |
| KR | 10-2006-0060994 | 6/2006 |
| KR | 10-2006-0065978 A | 6/2006 |
| KR | 10-2006-0073367 | 6/2006 |
| KR | 2006-0049050 | 6/2006 |
| KR | 2006-0059068 | 6/2006 |
| KR | 10-2006-0077887 A | 7/2006 |
| KR | 10-2006-0080475 | 7/2006 |
| KR | 10-2006-0080481 | 7/2006 |
| KR | 10-2006-0080482 | 7/2006 |
| KR | 10-2006-0081943 A | 7/2006 |
| KR | 10-2006-0083510 | 7/2006 |
| KR | 10-2006-0092387 A | 8/2006 |
| KR | 10-2006-0098755 | 9/2006 |
| KR | 10-2006-0104288 A | 10/2006 |
| KR | 10-2006-0104675 | 10/2006 |
| KR | 10-2006-0104677 | 10/2006 |
| KR | 10-2006-0109561 A | 10/2006 |

(56) References Cited

FOREIGN PATENT DOCUMENTS

| | | |
|---|---|---|
| KR | 10-2006-0109627 | 10/2006 |
| KR | 10-0635903 B1 | 10/2006 |
| KR | 10-2006-0114462 A | 11/2006 |
| KR | 10-2006-0114477 A | 11/2006 |
| KR | 10-2006-0114573 A | 11/2006 |
| KR | 10-0645719 B1 | 11/2006 |
| KR | 10-0646160 B1 | 11/2006 |
| KR | 10-2006-0123944 A | 12/2006 |
| KR | 10-0687007 B1 | 2/2007 |
| KR | 10-0696547 B1 | 3/2007 |
| KR | 10-0696550 B1 | 3/2007 |
| KR | 10-0697663 B1 | 3/2007 |
| KR | 10-0698033 B1 | 3/2007 |
| KR | 10-0700466 B1 | 3/2007 |
| KR | 10-2007-0035796 | 4/2007 |
| KR | 10-2007-037848 A | 4/2007 |
| KR | 10-0711885 B1 | 4/2007 |
| KR | 10-2007-0050793 | 5/2007 |
| KR | 10-0723627 B1 | 5/2007 |
| KR | 10-2007-0056190 A | 6/2007 |
| KR | 10-0726132 B1 | 6/2007 |
| KR | 10-0736218 B1 | 7/2007 |
| KR | 10-0739309 | 7/2007 |
| KR | 10-0741142 B1 | 7/2007 |
| KR | 10-2007-0078713 | 8/2007 |
| KR | 10-2007-0080635 | 8/2007 |
| KR | 10-2007-0091437 A | 9/2007 |
| KR | 10-2006-0028115 | 10/2007 |
| KR | 10-2007-0097218 | 10/2007 |
| KR | 10-2007-0098122 A | 10/2007 |
| KR | 10-2007-0101842 | 10/2007 |
| KR | 10-2007-0105595 | 10/2007 |
| KR | 10-0768212 B1 | 10/2007 |
| KR | 10-0770653 B1 | 10/2007 |
| KR | 10-2007-0112668 | 11/2007 |
| KR | 10-2007-0114094 A | 11/2007 |
| KR | 10-0787457 B1 | 12/2007 |
| KR | 10-2008-0001184 | 1/2008 |
| KR | 10-2008-0003720 A | 1/2008 |
| KR | 10-2008-0007896 A | 1/2008 |
| KR | 10-2008-0009285 A | 1/2008 |
| KR | 10-0797787 B1 | 1/2008 |
| KR | 10-0800125 B1 | 1/2008 |
| KR | 10-0815265 B1 | 3/2008 |
| KR | 10-2008-0036983 A | 4/2008 |
| KR | 10-0823508 B1 | 4/2008 |
| KR | 10-0823511 B1 | 4/2008 |
| KR | 10-2008-0044239 A | 5/2008 |
| KR | 10-2008-0044775 | 5/2008 |
| KR | 10-2008-0046761 A | 5/2008 |
| KR | 10-0827760 B1 | 5/2008 |
| KR | 10-2008-0048653 | 6/2008 |
| KR | 10-2008-0055124 A | 6/2008 |
| KR | 10-2008-0057159 A | 6/2008 |
| KR | 10-0839380 B1 | 6/2008 |
| KR | 10-2008-0060400 | 7/2008 |
| KR | 10-2008-0061132 | 7/2008 |
| KR | 10-2008-0061666 A | 7/2008 |
| KR | 10-2008-0061774 A | 7/2008 |
| KR | 10-2008-0062212 | 7/2008 |
| KR | 10-2008-0076574 A | 8/2008 |
| KR | 10-2008-0088737 A | 10/2008 |
| KR | 10-2008-0104479 A | 12/2008 |
| KR | 10-2008-0104695 A | 12/2008 |
| KR | 10-2009-0017910 A | 2/2009 |
| KR | 10-0889872 B1 | 3/2009 |
| KR | 10-2009-0038733 | 4/2009 |
| KR | 10-2009-0040618 | 4/2009 |
| KR | 10-2009-0047953 A | 5/2009 |
| KR | 10-2009-0052155 | 5/2009 |
| KR | 10-2009-0052828 A | 5/2009 |
| KR | 10-2009-0053417 | 5/2009 |
| KR | 10-0899279 B1 | 5/2009 |
| KR | 10-2009-0066996 A | 6/2009 |
| KR | 10-2009-0075887 A | 7/2009 |
| KR | 10-2009-0081717 A | 7/2009 |
| KR | 10-0908232 | 7/2009 |
| KR | 10-2009-0093161 | 9/2009 |
| KR | 10-2009-0094911 A | 9/2009 |
| KR | 10-2009-0097453 | 9/2009 |
| KR | 10-2009-0107702 | 10/2009 |
| KR | 10-0922763 A | 10/2009 |
| KR | 10-2010-0000128 | 1/2010 |
| KR | 10-2010-0000129 | 1/2010 |
| KR | 10-2010-0002381 A | 1/2010 |
| KR | 10-2010-0026655 | 3/2010 |
| KR | 10-2010-0038088 A | 4/2010 |
| KR | 10-2010-0044606 A | 4/2010 |
| KR | 10-2010-0047796 | 5/2010 |
| KR | 10-0961110 B1 | 6/2010 |
| KR | 10-2010-0090070 | 8/2010 |
| KR | 10-2010-0099806 A | 9/2010 |
| KR | 10-2010-0119368 A | 11/2010 |
| KR | 10-2010-0126125 A | 12/2010 |
| KR | 10-2010-0128589 A | 12/2010 |
| KR | 10-2010-0130786 A | 12/2010 |
| KR | 10-2010-0133678 A | 12/2010 |
| KR | 10-2010-0138139 A | 12/2010 |
| KR | 10-1017654 B1 | 2/2011 |
| KR | 10-2011-0021090 A | 3/2011 |
| KR | 10-2011-0022512 A | 3/2011 |
| KR | 10-2011-0032589 A | 3/2011 |
| KR | 10-2011-0082418 A | 7/2011 |
| KR | 10-2011-0101767 | 9/2011 |
| KR | 10-2011-0110525 A | 10/2011 |
| KR | 10-2011-0120213 A | 11/2011 |
| KR | 10-2011-0138787 A | 12/2011 |
| KR | 10-2012-0006322 A | 1/2012 |
| KR | 10-2012-0006324 A | 1/2012 |
| KR | 10-2012-0012300 | 2/2012 |
| KR | 10-2012-0042155 A | 5/2012 |
| KR | 10-2012-0065789 A | 6/2012 |
| KR | 10-2012-0080855 A | 7/2012 |
| KR | 10-2012-0081811 A | 7/2012 |
| KR | 10-1193186 B1 | 10/2012 |
| KR | 10-2012-0131545 A | 12/2012 |
| KR | 10-2013-0007308 A | 1/2013 |
| WO | WO 99/25894 | 5/1999 |
| WO | 03043067 A1 | 5/2003 |
| WO | WO2004016406 A1 | 2/2004 |
| WO | 2008004792 A1 | 1/2008 |

OTHER PUBLICATIONS

KIPO Registration Determination Certificate dated Apr. 30, 2012, for Korean priority Patent application 10-2010-0066992, (5 pages).
Japanese Office action dated Aug. 21, 2012, for Japanese Patent application 2010-145075, (5 pages).
KIPO Office action dated Sep. 1, 2012, for Korean Patent application 10-2010-0010136, (5 pages).
KIPO Notice of Allowance dated Sep. 1, 2012, for Korean Patent application 10-2010-0013848, (5 pages).
KIPO Notice of Allowance dated Sep. 1, 2012, for Korean Patent application 10-2010-0009160, (5 pages).
Japanese Office action dated Sep. 4, 2012, for Japanese Patent application 2010-152846, (4 pages).
U.S. Notice of Allowance dated Jun. 30, 2014, issued to U.S. Appl. No. 12/907,396 (40 pages).
U.S. Office action dated Jun. 17, 2014, issued to U.S. Appl. No. 13/157,220 (36 pages).
KIPO Registration Determination Certificate dated Sep. 28, 2011, for Korean Patent application 10-2009-0052357, 5 pages.
KIPO Registration Determination Certificate dated Nov. 25, 2011, for Korean Patent application 10-2010-0014277, 5 pages.
KIPO Office action dated Feb. 1, 2012, for Korean Patent application 10-2010-0011196, 4 pages.
KIPO Office action Feb. 1, 2012, for Korean Patent application 10-2010-0013848.
KIPO Registration Determination CertificateOffice action dated Jan. 13, 2012, for Korean Patent application 10-2009-0056529, 5 pages.
Patent Abstracts of Japan, and English machine translation of Japanese Publication 2001-052862, 20 pages.

(56) References Cited

OTHER PUBLICATIONS

Patent Abstracts of Japan, and English machine translation of Japanese Publication 2003-003250, 25 pages.
Korean Patent Abstracts, Publication No. 1020020086047, dated Nov. 18, 2002, for corresponding Korean Patent 10-0405080 listed above.
Korean Patent Abstracts, Publication No. 1020020088662, dated Nov. 29, 2002, for corresponding Korean Patent 10-0463212 listed above.
Korean Patent Abstracts, Publication No. 1020050045619, dated May 17, 2005, for corresponding Korean Patent 10-0520159 listed above.
Korean Patent Abstracts, Publication No. 1020040062203, dated Jul. 7, 2002, for corresponding Korean Patent 10-0646160 listed above.
Korean Patent Abstracts, Publication No. 1020060101987, dated Sep. 27, 2006, for corresponding Korean Patent 10-0687007 listed above.
Korean Patent Abstracts, Publication No. 1020020056238, dated Jul. 10, 2002, for corresponding Korean Patent 10-0698033 listed above.
Korean Patent Abstracts, Publication No. 1020050078637, dated Aug. 5, 2005, for corresponding Korean Patent 10-0700466 listed above.
Korean Patent Abstracts, Publication No. 1020070025164, dated Mar. 8, 2007, for corresponding Korean Patent 10-0711885 listed above.
Korean Patent Abstracts, Publication No. 1020020034272, dated May 9, 2002, for corresponding Korean Patent 10-0726132 listed above.
Korean Patent Abstracts, Publication No. 1020060126267, dated Dec. 6, 2006, for corresponding Korean Patent 10-0797787 listed above.
English Abstract, Publication No. 1020080002189, dated Jan. 4, 2008, for corresponding Korean Patent 10-0800125 listed above.
Korean Patent Abstracts, Publication No. 1020070050793. dated May 16, 2007, for corresponding Korean Patent 10-0815265 listed above.
Korean Patent Abstracts, Publication No. 1020010062735, dated Jul. 7, 2001, for corresponding Korean Patent 10-0827760 listed above.
Korean Patent Abstracts, Publication No. 1020080038650, dated May 7, 2008, for corresponding Korean Patent 10-0839380 listed above.
European Search Report dated May 13, 2011 for European Application No. 11250019.4 (6 pages).
European Search Report dated May 20, 2011 for European Application No. 10251404.9 (12 pages).
European Search Report dated May 27, 2011 for European Application No. 10251514.5 (11 pages).
European Search Report dated Sep. 6, 2010 for European Application No. 10250962.7 (5 pages).
Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Apr. 26, 2012 for Korean Application No. 10-2010-0066991 (5 pages).
KIPO Notice of Allowance dated Aug. 24, 2012, issued to KR 10-2010-0066993 (5 pages).
KIPO Notice of Allowance dated Oct. 27, 2011 for Korean Application No. 10-2010-0002381 (5 pages).
KIPO Notice of Allowance dated Oct. 31, 2011, for Korean Patent application 10-2010-0014273, ( 5 pages).
KIPO Notice of Allowance dated Sep. 1, 2012, for Korean Patent application 10-2010-0013847 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Notice of Allowance, dated Sep. 1, 2012, issued to KR 10-2010-0014276 (5 pages).
KIPO Office action dated Apr. 2, 2012, issued to KR 10-2010-0066993 (4 pages).
KIPO Office action dated Apr. 4, 2012, issued in KR Application No. 10-2009-0112796 (5 pages).
KIPO Office Action dated Apr. 9, 2012 for Korean Application No. 10-2010-0031556 (4 pages).
KIPO Office action dated Aug. 1, 2011, issued to KR 10-2009-0074001 (3 pages).
KIPO Office Action dated Aug. 28, 2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0014272 (4 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office Action dated Feb. 6, 2012, issued to KR 10-2010-0014274 (9 pages).
KIPO Office Action dated Feb. 6, 2012, issued to KR 10-2010-0021835 (4 pages).
KIPO Office action dated Jan. 6, 2012, issued to KR Application No. 10-2010-0000897 (4 pages).
KIPO Office action dated Jul. 1, 2011, issued to KR Application No. 10-2009-0072111 (4 pages).
KIPO Office action dated Jun. 1, 2011, issued to KR Application No. 10-2009-0050528 (4 pages).
KIPO Office action dated Mar. 21, 2012, issued to KR Application No. 10-2010-0065465 (5 pages).
KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate dated Nov. 30, 2011, for Korean application 10-2009-0056530 (5 pages).
KIPO Registration Determination Certificate, dated Jul. 20, 2012, issued to KR Application No. 10-2010-0000897 (5 pages).
Korean Registration Certificate dated Sep. 28, 2011 for Korean Application No. 10-2009-0045200 (5 pages).
SIPO Certificate of Patent dated Aug. 14, 2013, for Chinese application 20100266406.6, (36 pages).
SIPO Certificate of Patent dated Jul. 31, 2013, corresponding to Chinese Patent application 201110029291.3, (31 pages).
SIPO Office action dated Dec. 17, 2013, for Chinese Patent application 201010216896.9 (6 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).
SIPO Office Action dated Oct. 9, 2012 for Chinese Application No. 201010266406.6 (6 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).

(56) References Cited

OTHER PUBLICATIONS

U.S. Notice of Allowance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).
U.S. Notice of Allowance dated Jun. 11, 2014, issued to U.S. Appl. No. 13/468,835 (62 pages).
U.S. Notice of Allowance dated May 9, 2014 for U.S. Appl. No. 13/194,759 (27 pages).
U.S. Office action dated Apr. 1, 2013, issued to U.S. Appl. No. 12/784,774 (44 pages).
U.S. Office action dated Apr. 18, 2014, issued to U.S. Appl. No. 12/814,816 (9 pages).
U.S. Office action dated Apr. 29, 2013, issued to U.S. Appl. No. 12/820,355 (31 pages).
U.S. Office action dated Aug. 13, 2013, issued to U.S. Appl. No. 13/194,759, (28 pages).
U.S. Office Action dated Aug. 2, 2013 for U.S. Appl. No. 12/868,099 (32 pages).
U.S. Office action dated Aug. 21, 2013 issued in cross-reference U.S. Appl. No. 12/820,355 (14 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 13, 2013, issued to U.S. Appl. No. 13/180,454 (18 pages).
U.S. Office action dated Dec. 16, 2013 for U.S. Appl. No. 14/054,536 (35 pages).
U.S. Office action dated Dec. 17, 2012, issued to U.S. Appl. No. 12/873,556 (37 pages).
U.S. Office action dated Dec. 2, 2013, issued to U.S. Appl. No. 13/157,220 (33 pages).
U.S. Office action dated Dec. 26, 2012, issued to U.S. Appl. No. 12/815,673 (21 pages).
U.S. Office action dated Feb. 11, 2014, for cross reference U.S. Appl. No. 13/178,472 (8 pages).
U.S. Office action dated Feb. 26, 2013, issued to U.S. Appl. No. 12/794,093 (31 pages).
U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 11, 2013, issued to U.S. Appl. No. 12/862,125 (37 pages).
U.S. Office action dated Jun. 17, 2013, for cross reference U.S. Appl. No. 13/180,454, (23 pages).
U.S. Office Action dated Jun. 21, 2011 for U.S. Appl. No. 12/862,153 (21 pages).
U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 17, 2014, for U.S. Appl. No. 12/950,361 (48 pages).
U.S. Office action dated Mar. 18, 2013, issued to U.S. Appl. No. 12/984,231 (29 pages).
U.S. Office action dated Mar. 19, 2013, issued to U.S. Appl. No. 13/194,759 (36 pages).
U.S. Office action dated Mar. 22, 2013, issued to U.S. Appl. No. 12/987,569 (12 pages).
U.S. Office Action dated Mar. 23, 2012 for U.S. Appl. No. 12/849,193 (17 pages).
U.S. Office action dated May 21, 2014, issued to U.S. Appl. No. 13/014,225 (15 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated May 24, 2013, issued to U.S. Appl. No. 12/849,092 (31 pages).
U.S. Office action dated May 6, 2014, issued to U.S. Appl. No. 13/467,998 (21 pages).
U.S. Office Action dated May 7, 2013, issued in U.S. Appl. No. 12/820,270 (37 pages).
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
U.S. Office Action dated Oct. 3, 2012 for U.S. Appl. No. 12/869,830 (28 pages).
U.S. Office action dated Oct. 7, 2013, issued to U.S. Appl. No. 13/279,077, (29 pages).
U.S. Office action dated Sep. 20, 2013, issued to U.S. Appl. No. 13/014,225, (33 pages).
U.S. Office action dated Sep. 25, 2013, for U.S. Appl. No. 13/031,756, (34 pages).
U.S. Office action dated Sep. 27, 2013, issued to U.S. Appl. No. 12/814,816 (19 pages).
U.S. Patent Office Action dated May 16, 2013, issued to U.S. Appl. No. 13/235,337 (28 pages).
US Notice of Allowance, dated Mar. 18, 2013, issued to U.S. Appl. No. 12/795,001 (29 pages).
US Office action dated Dec. 20, 2012, issued to U.S. Appl. No. 12/984,289 (20pages).
US Office action dated Sep. 12, 2012, in U.S. Appl. No. 12/815,673 (26 pages).

\* cited by examiner

ORGANIC LAYER DEPOSITION APPARATUS

CROSS-REFERENCE TO RELATED PATENT APPLICATION

This application claims priority to and the benefit of Korean Patent Application No. 10-2010-0107712, filed on Nov. 1, 2010, in the Korean Intellectual Property Office, the entire content of which is incorporated herein by reference.

BACKGROUND

1. Field

One or more aspects of the present invention relate to an organic layer deposition apparatus.

2. Description of the Related Art

Organic light-emitting display devices have a larger viewing angle, better contrast characteristics, and a faster response rate than other display devices, and thus have drawn attention as next-generation display devices.

An organic light-emitting display device includes intermediate layers, including an emission layer disposed between a first electrode and a second electrode that are arranged opposite to each other. The electrodes and the intermediate layers may be formed by using various methods, one of which is to perform a separate deposition method for each layer. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having a desired pattern.

However, the deposition method using such a FMM is not suitable for manufacturing larger devices using a mother glass having a fifth generation (5G) size sheet or greater. In other words, when such a large mask is used, the mask may bend due to self-gravity, thereby distorting a pattern. This is not conducive for the recent trend towards high-definition patterns.

SUMMARY

In order to address the drawback of the deposition method using a fine metal mask (FMM), one or more aspects of the present invention are directed toward an organic layer deposition apparatus that can be simply applied to produce large-sized display devices on a mass scale and can reduce or prevent a pattern from being shifted and a shadow from being created, which are caused when a patterning slit sheet is sagging.

According to an embodiment of the present invention, there is provided an organic layer deposition apparatus for forming an organic layer on a substrate, the apparatus including a deposition source for discharging a deposition material; a deposition source nozzle unit disposed at a side of the deposition source and including a plurality of deposition source nozzles arranged in a first direction; and a patterning slit sheet disposed to face the deposition source nozzle unit and including a plurality of patterning slits arranged in a second direction perpendicular to the first direction. The plurality of patterning slits include a central patterning slit formed at a center of the patterning slit sheet; a plurality of left patterning slits disposed to the left of the central patterning slit; and a plurality of right patterning slits disposed to the right of the central patterning slit. The plurality of left patterning slits and the plurality of right patterning slits bend toward the central patterning slit.

A lengthwise direction of the central patterning slit may be parallel with the first direction.

The plurality of left patterning slits and the plurality of right patterning slits may bend toward a midpoint on the central patterning slit.

Widths of the plurality of patterning slits may be the same.

Distances between adjacent left patterning slits may be the same.

Distances between adjacent right patterning slits may be the same.

Distances between adjacent patterning slits may not be the same.

The farther the plurality of left patterning slits are located away from the central patterning slit, the shorter the distances between adjacent left patterning slits may be.

The farther the plurality of right patterning slits are located away from the central patterning slit, the shorter the distances between adjacent right patterning slits may be.

Widths of the plurality of patterning slits may be the same.

Widths of the plurality of patterning slits may not be the same.

The farther the plurality of left patterning slits are located away from the central patterning slit, the less the widths of the plurality of left patterning slits may be.

The farther the plurality of right patterning slits are located away from the central patterning slit, the less the widths of the plurality of right patterning slits may be.

Distances between adjacent left patterning slits may be the same.

Distances between adjacent right patterning slits may be the same.

The deposition source, the deposition source nozzle unit, and the patterning slit sheet may be integrated as one body.

The deposition source, the deposition source nozzle unit, and the patterning slit sheet may be integrated as one body via connection members that guide movement of the deposition material.

The connection members may be formed to seal a space between the deposition source, the deposition source nozzle unit, and the patterning slit sheet.

The plurality of deposition source nozzles may be tilted at a set or predetermined angle.

The plurality of deposition source nozzles may include deposition source nozzles arranged in two rows in the first direction, wherein the deposition source nozzles in the two rows are tilted to face each other.

The plurality of deposition source nozzles may include deposition source nozzles arranged in first and second rows in the first direction. The deposition source nozzles of the first row located to overlap a left side of the patterning slit sheet may be arranged to face a right side of the patterning slit sheet. The deposition source nozzles of the second row located to overlap the right side of the patterning slit sheet may be arranged to face the left side of the patterning slit sheet.

The central patterning slit may extend along a direction to correspond to the first direction in which the plurality of deposition source nozzles are arranged.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
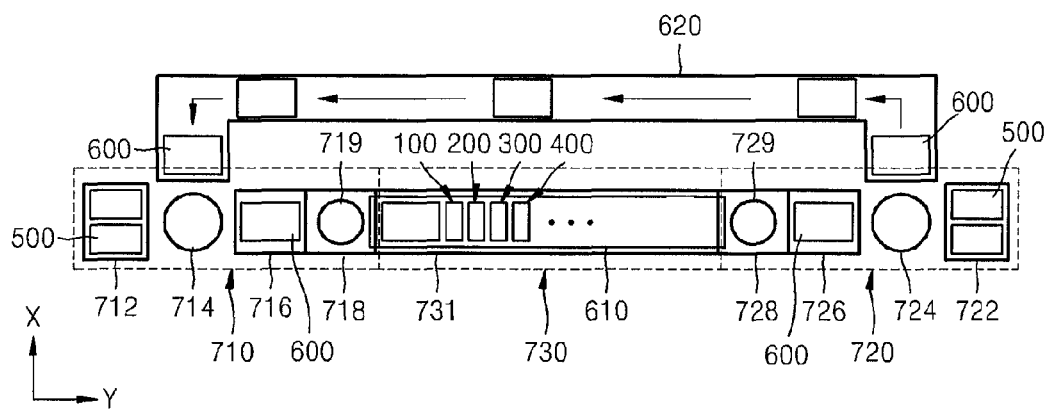
FIG. 1 illustrates an organic layer deposition system that includes an organic layer deposition apparatus according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when a first element is referred to as being "on" a second element, it can be directly on the second element or be indirectly on the second element with one or more intervening elements interposed therebetween. Like reference numerals designate like elements throughout the specification.

Figure 2:
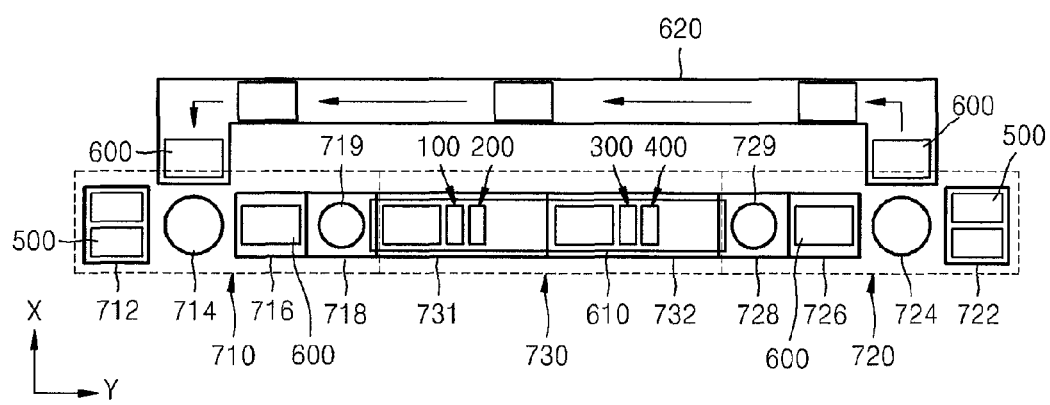
FIG. 2 illustrates a modified example of the organic layer deposition system of FIG. 1.
Figure 3:
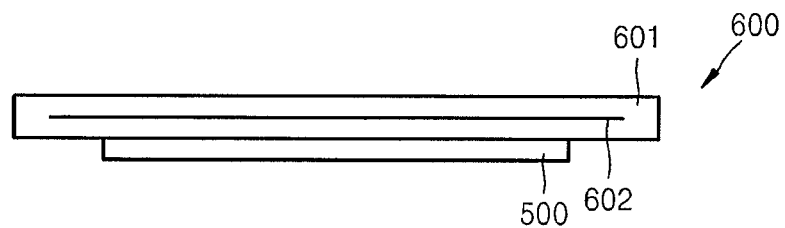
FIG. 3 is a schematic view of an electrostatic chuck according to an embodiment of the present invention.

FIG. 1 illustrates an organic layer deposition system that includes an organic layer deposition apparatus according to an embodiment of the present invention. FIG. 2 illustrates a modified example of the organic layer deposition system of FIG. 1. FIG. 3 is a schematic view of an electrostatic chuck 600 according to an embodiment of the present invention.

Referring to FIG. 1, the organic layer deposition apparatus includes a loading unit 710, a deposition unit 730, an unloading unit 720, a first conveyer unit 610, and a second conveyer unit 620.

The loading unit 710 may include a first rack 712, a transport robot 714, a transport chamber 716, and a first inversion chamber 718.

A plurality of substrates 500 onto which a deposition material is not applied are stacked up on the first rack 712. The transport robot 714 picks up one of the substrates 500 from the first rack 712, disposes it on an electrostatic chuck 600 transferred by the second conveyor unit 620, and moves the electrostatic chuck 600 having the substrate 500 thereon into the transport chamber 716.

The first inversion chamber 718 is disposed adjacent to the transport chamber 716. A first inversion robot 719 disposed in the first inversion chamber 718 inverts the electrostatic chuck 600 and then loads it into the first conveyer unit 610 of the deposition unit 730.

Referring to FIG. 3, the electrostatic chuck 600 may include an electrode 602 embedded in a main body 601 of the electrostatic chuck 600. Here, the main body 601 is formed of ceramic, and the electrode 602 is supplied with power. The substrate 500 is attached to a surface of the main body 601 when high voltage is applied to the electrode 602.

Referring back to FIG. 1, the transport robot 714 places one of the substrates 500 on the electrostatic chuck 600, and the electrostatic chuck 600 having the substrate 500 thereon is loaded into the transport chamber 716. The first inversion robot 719 inverts the electrostatic chuck 600 so that the substrate 500 is turned upside down in the deposition unit 730.

The unloading unit 720 is constituted to operate in an opposite manner to the loading unit 710 described above. Specifically, a second inversion robot 729 in a second inversion chamber 728 inverts the electrostatic chuck 600 having the substrate 500 thereon, which has passed through the deposition unit 730, and then moves the electrostatic chuck 600 having the substrate 500 thereon into an ejection chamber 726. Then, an ejection robot 724 removes the electrostatic chuck 600 having the substrate 500 thereon from the ejection chamber 726, separates the substrate 500 from the electrostatic chuck 600, and then loads the substrate 500 onto the second rack 722. The electrostatic chuck 600 separated from the substrate 500 is returned back into the loading unit 710 via the second conveyer unit 620.

However, the present invention is not limited to the above description. For example, when the substrate 500 is initially disposed on the electrostatic chuck 600, the substrate 500 may be fixed onto a bottom surface of the electrostatic chuck 600 and then moved into the deposition unit 730. In this case, for example, the first inversion chamber 718 and the first inversion robot 719, and the second inversion chamber 728 and the second inversion robot 729 are not required.

The deposition unit 730 may include at least one deposition chamber. Referring to FIG. 1, the deposition unit 730 may include a first chamber 731, in which first to four organic layer deposition apparatuses 100, 200, 300, and 400 are disposed. Although FIG. 1 illustrates that a total of four organic layer deposition apparatuses, i.e., the first to fourth organic layer deposition apparatuses 100 to 400, are installed in the first chamber 731, the total number of organic layer deposition apparatuses that may be installed in the first chamber 731 may vary according to a deposition material and deposition conditions. The first chamber 731 is maintained in a vacuum state during a deposition process.

Referring to FIG. 2, according to another embodiment of the present invention, the deposition unit 730 may include the first chamber 731 and a second chamber 732 that are connected to each other. The first and second organic layer deposition apparatuses 100 and 200 may be disposed in the first chamber 731, and the third and fourth organic layer deposition apparatuses 300 and 400 may be disposed in the second chamber 732. In this regard, more than two chambers may be used.

In the current embodiment of FIG. 1, the electrostatic chuck 600 having the substrate 500 thereon may be moved at least to the deposition unit 730 or may be moved sequentially to the loading unit 710, the deposition unit 730, and the unloading unit 720 by the first conveyor unit 610. If the substrate 500 is separated from the electrostatic chuck 600 by the unloading unit 720, then the electrostatic chuck 600 is moved back to the loading unit 710 by the second conveyor unit 620.

Figure 4:
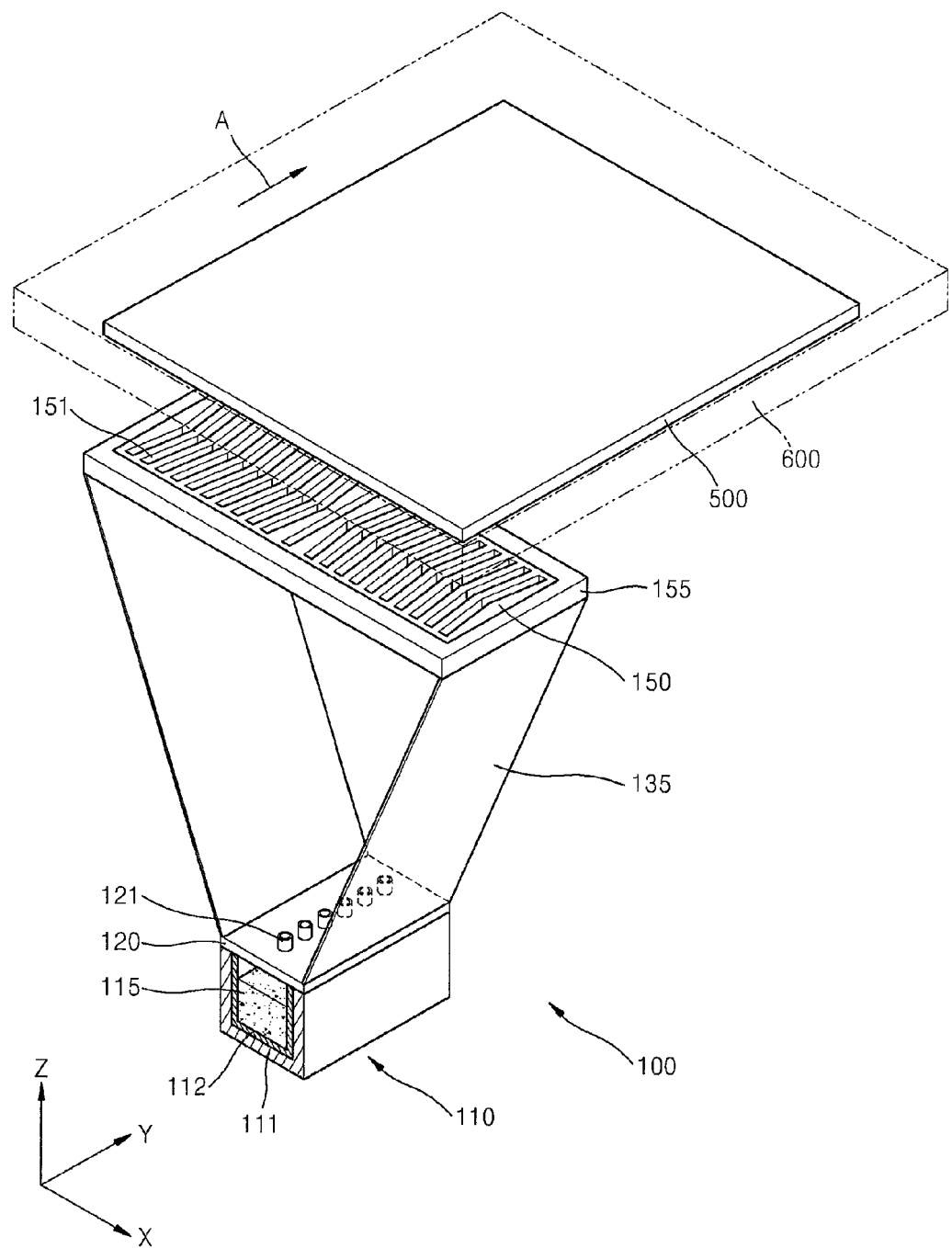
FIG. 4 is a schematic perspective view of an organic layer deposition apparatus according to an embodiment of the present invention.
Figure 5:
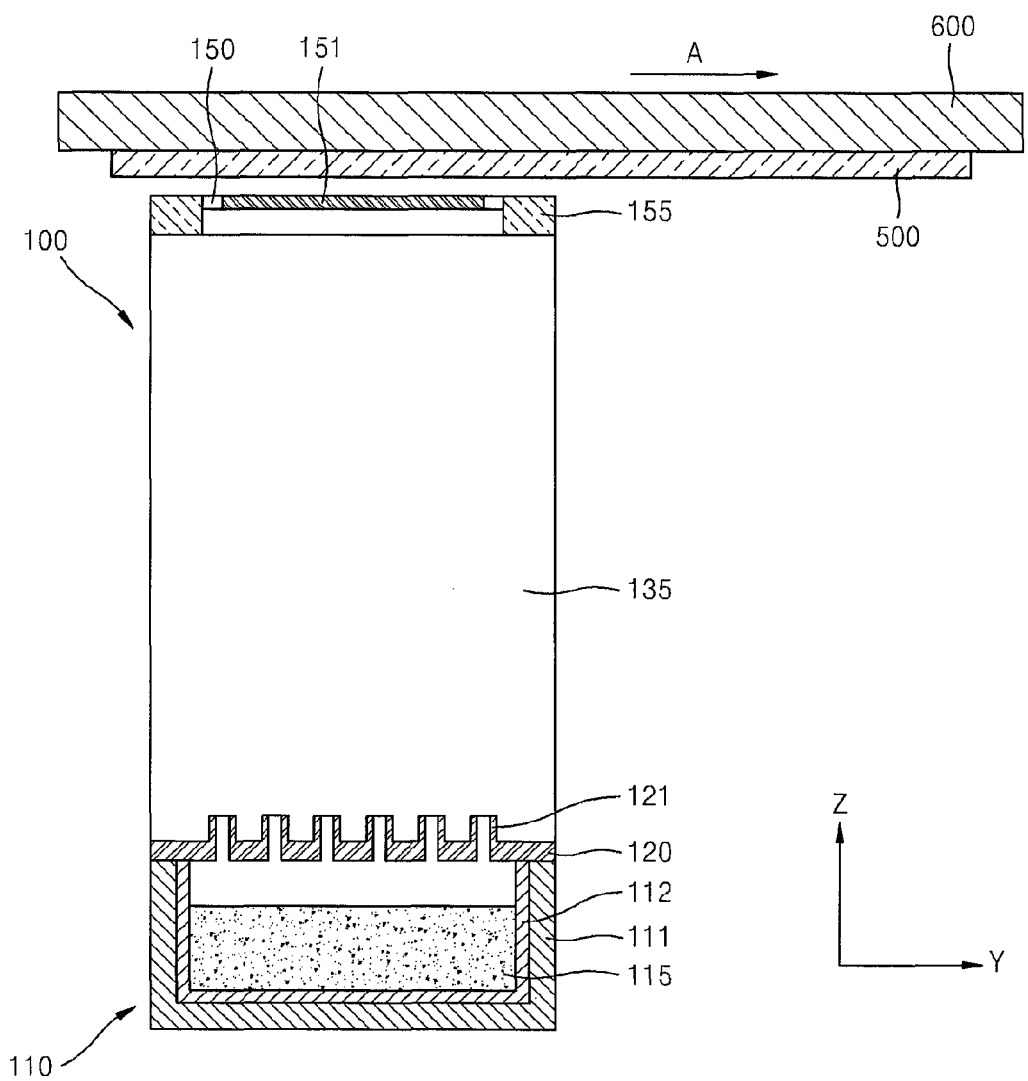
FIG. 5 is a schematic side sectional view of the organic layer deposition apparatus of FIG. 4.
Figure 6:
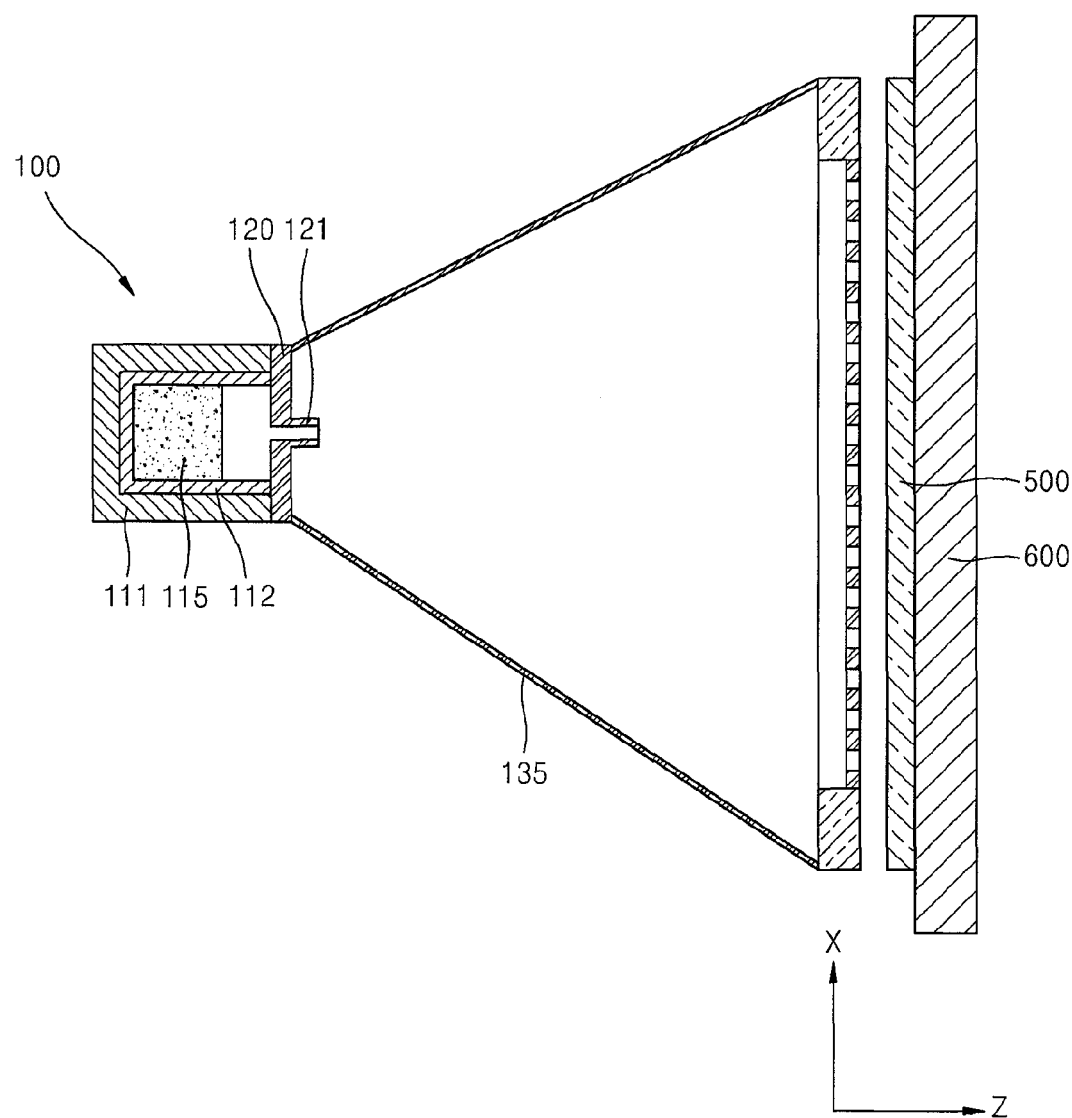
FIG. 6 is a schematic plan view of the organic layer deposition assembly of FIG. 4.

FIG. 4 is a schematic perspective view of an organic layer deposition apparatus 100 according to an embodiment of the present invention. FIG. 5 is a schematic side sectional view of the organic layer deposition apparatus 100 of FIG. 4. FIG. 6 is a schematic plan sectional view of the organic layer deposition apparatus 100 of FIG. 4.

Referring to FIGS. 3, 4 and 6, the organic layer deposition apparatus 100 includes a deposition source 110, a deposition source nozzle unit 120, and a patterning slit sheet 150.

Specifically, the first chamber 731 of FIG. 1 should be basically maintained in a high-vacuum state as in a deposition method using a fine metal mask (FMM) so that a deposition material 115 emitted from the deposition source 110 and discharged through the deposition source nozzle unit 120 and the patterning slit sheet 150 may be deposited onto a substrate 500 in a desired pattern. In addition, the temperature of the patterning slit sheet 150 should be sufficiently lower than the temperature of the deposition source 110. In this regard, the temperature of the patterning slit sheet 150 may be about 100° C. or less. The temperature of the patterning slit sheet 150 should be sufficiently low so as to reduce thermal expansion of the patterning slit sheet 150.

The substrate 500 that is a deposition target substrate is disposed in the first chamber 731. The substrate 500 may be a substrate for flat panel displays. A large substrate, such as a mother glass, for manufacturing a plurality of flat panel displays, may be used as the substrate 500. Other suitable substrates may also be employed.

In the current embodiment, deposition is performed while the substrate 500 is moved relative to the organic layer deposition apparatus 100.

In particular, in the conventional deposition method using an FMM, the size of the FMM has to be equal to the size of a substrate. Thus, since the size of the FMM has to be increased as the substrate becomes larger, it is neither straightforward to manufacture a large FMM nor to extend an FMM to be accurately aligned with a pattern.

In order to overcome this problem, in the organic layer deposition apparatus 100 according to the current embodiment, deposition may be performed while the organic layer deposition apparatus 100 or the substrate 500 is moved relative to the other. In other words, deposition may be continuously performed while the substrate 500, which is disposed such as to face the organic layer deposition apparatus 100, is moved in a Y-axis direction. That is, deposition may be performed in a scanning manner while the substrate 500 is moved in a direction (first direction) indicated by an arrow A in FIG. 4.

In the organic layer deposition apparatus 100 according to the current embodiment, the patterning slit sheet 150 may be significantly smaller than a FMM used in the conventional deposition method. In other words, in the organic layer deposition apparatus 100, deposition is continuously performed, i.e., in a scanning manner while the substrate 500 is moved in the Y-axis direction. Thus, lengths of the patterning slit sheet 150 in the X-axis and Y-axis directions may be significantly less than the lengths of the substrate 500 in the X-axis and Y-axis directions. As described above, since the patterning slit sheet 150 may be formed to be significantly smaller than the FMM used in the conventional deposition method, it is relatively easy to manufacture the patterning slit sheet 150. In other words, using the patterning slit sheet 150, which is smaller than the FMM used in the conventional deposition method, is more convenient in all processes, including etching and other subsequent processes, such as precise extension, welding, moving, and cleaning processes, compared to the conventional deposition method using the larger FMM. This is more advantageous for a relatively large display device.

The deposition source 110 that contains and heats the deposition material 115 is disposed in an opposite side of the first chamber 731 to a side in which the substrate 500 is disposed. While being vaporized in the deposition source 110, the deposition material 115 is deposited on the substrate 500.

In particular, the deposition source 110 includes a crucible 112 filled with the deposition material 115, and a cooling block 111 that heats the crucible 112 to vaporize the deposition material 115 contained in the crucible 112 towards a side of the crucible 112, and in particular, towards the deposition source nozzle unit 120. The cooling block 111 reduces or prevents radiation of heat from the crucible 112 to the outside, e.g., into the first chamber 731. The cooling block 111 may include a heater that heats the crucible 112.

The deposition source nozzle unit 120 is disposed at a side of the deposition source 110, and in particular, at the side of the deposition source 110 facing the substrate 500. The deposition source nozzle unit 120 includes a plurality of deposition source nozzles 121 that may be arranged at equal intervals in the Y-axis direction, i.e., a scanning direction of the substrate 500. The deposition material 115, which is vaporized in the deposition source 110, passes through the deposition source nozzle unit 120 towards the substrate 500. As described above, when the deposition source nozzle unit 120 includes the plurality of deposition source nozzles 121 arranged in the Y-axis direction, that is, the scanning direction of the substrate 500, the size of a pattern formed of the deposition material 115 discharged through each of a plurality of patterning slits 151 of the patterning slit sheet 150 is affected by the size of one of the deposition source nozzles 121 (since there is only one line of the deposition source nozzles 121 in the X-axis direction). Thus, no shadow zone may be formed on the substrate 500. In addition, since the plurality of deposition source nozzles 121 are arranged in the scanning direction of the substrate 500, even if there is a difference in flux between the deposition source nozzles 121, the difference may be compensated for and deposition uniformity may be maintained constant.

The patterning slit sheet 150 and a frame 155 are disposed between the deposition source 110 and the substrate 500. A shape of the frame 155 is similar to a window frame. The patterning slit sheet 150 is bound inside the frame 155. The patterning slit sheet 150 includes the plurality of patterning slits 151 arranged in the X-axis direction. The deposition material 115, which is vaporized in the deposition source 110, passes through the deposition source nozzle unit 120 and the patterning slit sheet 150 towards the substrate 500. The patterning slit sheet 150 may be manufactured by etching, which is the same method as used in a conventional method of manufacturing an FMM, and in particular, a striped FMM. In this regard, the total number of the patterning slits 151 may be greater than the total number of the deposition source nozzles 121.

The patterning slit sheet 150 may further include a supporter so as to block or prevent the patterning slit sheet 150 from sagging toward the deposition source 110. This will be described later.

In addition, the deposition source 110 and the deposition source nozzle unit 120 coupled to the deposition source 110 may be disposed to be separated from the patterning slit sheet 150 by a set or predetermined distance. The deposition source 110 and the deposition source nozzle unit 120 coupled to the deposition source 110 may be connected to the patterning slit sheet 150 by first connection members 135. That is, the deposition source 110, the deposition source nozzle unit 120, and the patterning slit sheet 150 may be integrally formed as one body by being connected to each other via the first connection members 135. The first connection members 135 may guide the deposition material 115 which is discharged through the deposition source nozzles 121, to move straight and not to flow in the X-axis direction. Referring to FIG. 4, the first connection members 135 are formed on left and right sides of the deposition source 110, the deposition source nozzle unit 120, and the patterning slit sheet 150 to guide the deposition material 115 not to flow in the X-axis direction; however, aspects of the present invention are not limited thereto. For example, the first connection members 135 may be formed in the form of a sealed box so as to guide the deposition material 115 to not flow in both the X-axis and Y-axis directions.

As described above, the organic layer deposition apparatus 100 according to the current embodiment performs deposition while being moved relative to the substrate 500. In order to move the organic layer deposition apparatus 100 relative to the substrate 500, the patterning slit sheet 150 is separated from the substrate 500 by a predetermined distance.

In particular, in the conventional deposition method using a FMM, deposition is performed with the FMM in close contact with a substrate in order to reduce or prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the organic layer deposition apparatus 100 according to the current embodiment, the patterning slit sheet 150 is disposed to be separated from the substrate 500 by a set or predetermined distance.

As described above, according to an embodiment of the present invention, a mask is formed to be smaller than a substrate, and deposition is performed while the mask is moved relative to the substrate. Thus, the mask can be easily manufactured. In addition, defects caused due to the contact between a substrate and a FMM, which occur in the conventional deposition method, may be reduced or prevented. Furthermore, since it is unnecessary to dispose the FMM in close contact with the substrate during a deposition process, the manufacturing time may be reduced.

Hereinafter, a structure of patterning slits formed in a patterning slit sheet of an organic layer deposition apparatus according to the embodiment of the present invention will be described in more detail.

Figure 7:
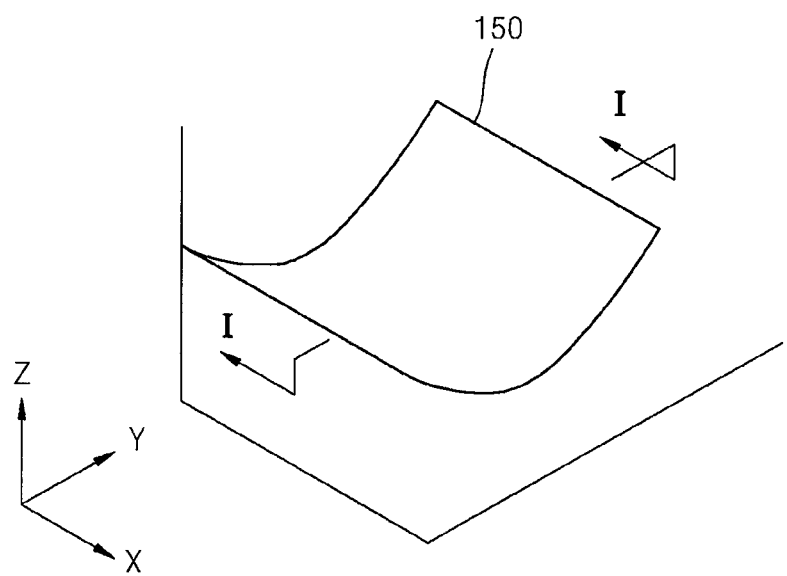
FIG. 7 is a schematic perspective view illustrating a state in which a patterning slit sheet is sagging.
Figure 8:
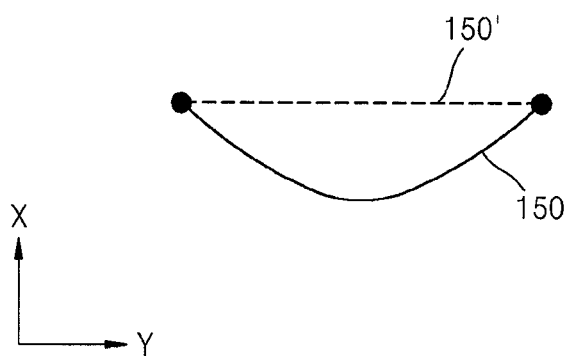
FIG. 8 is a cross-sectional view taken along the line I-I of FIG. 7.
Figure 9:
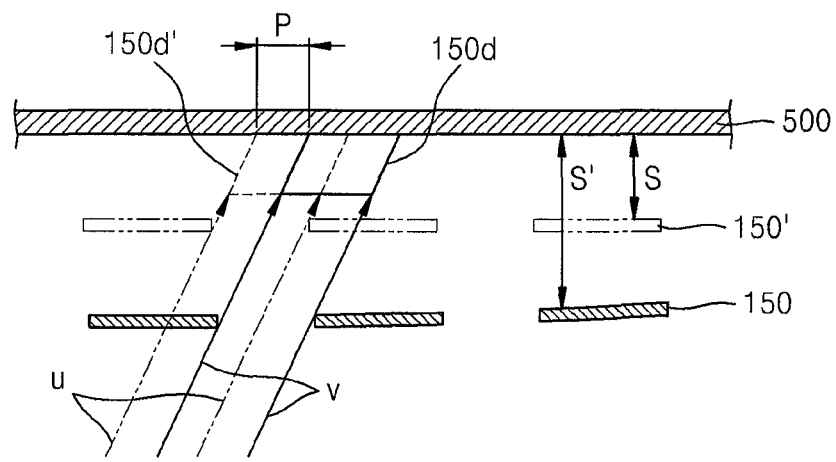
FIG. 9 illustrates a diagram comparing an organic layer pattern to be formed when a patterning slit sheet is sagging to an organic layer pattern to be formed when the patterning is not sagging.
Figure 10:
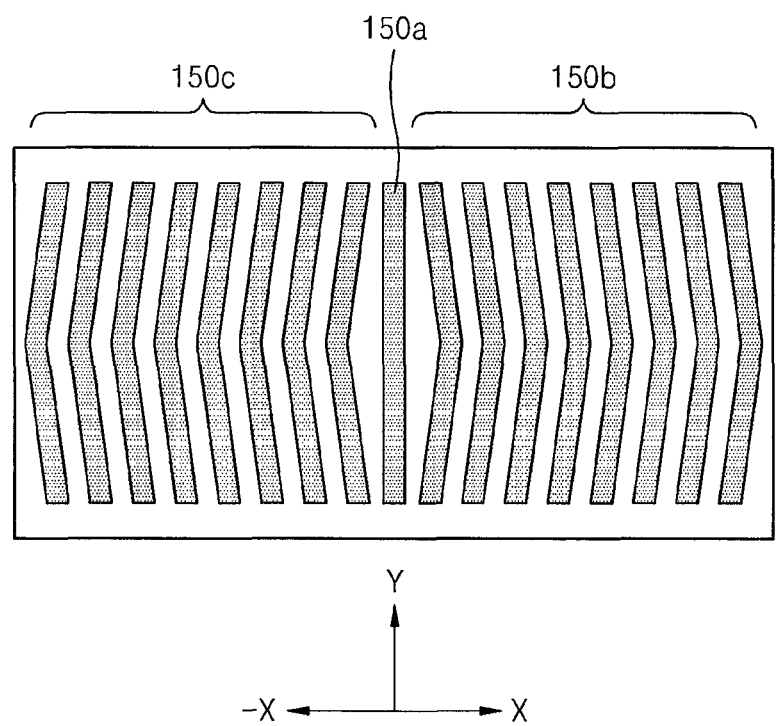
FIG. 10 illustrates an organic layer pattern formed on a substrate when a patterning slit sheet is sagging.

FIG. 7 is a schematic perspective view illustrating a state in which a patterning slit sheet 150 is sagging. FIG. 8 is a cross-sectional view taken along the line I-I of FIG. 7. FIG. 9 illustrates a diagram comparing an organic layer pattern to be formed when the patterning slit sheet 150 is sagging to an organic layer pattern to be formed when the patterning 150 is not sagging. FIG. 10 illustrates an organic layer pattern formed on a substrate when a patterning slit sheet is sagging.

Referring to FIGS. 7 and 8, the patterning slit sheet 150 is sagging in a Z-axis direction. Referring to FIGS. 8 and 9, the originally positioned patterning slit sheet 150' is disposed on an XY plane in parallel with the ground surface, and the substrate 500 may be disposed apart from the patterning slit sheet 150' and be moved on the XY plane in a Y-axis direction. Since the originally positioned patterning slit sheet 150' is disposed in parallel with the ground surface, it sags toward the ground surface, i.e., in the Z-axis direction, due to self-gravity, as the sagging patterning slit sheet 150.

When the originally positioned patterning slit sheet 150' sags toward the ground surface, the distance between the deposition source nozzles 121 (see FIG. 4) and the patterning slit sheet 150 that is sagging is not the same as when the originally positioned patterning slit sheet 150' is not sagging and is disposed parallel with the ground surface. That is, FIG. 9 illustrates an organic layer pattern expected to be formed by using the patterning slit sheet 150 that is sagging. Referring to FIG. 9, the distance S between the originally positioned patterning slit sheet 150' and the substrate 500 is maintained constant. In this case, referring to FIGS. 4 and 9, the deposition material 115 discharged from the deposition source nozzles 121 is moved along a path u, passes through the originally positioned patterning slit sheet 150', and is finally deposited on the substrate 500, thereby forming an organic layer 150d'. However, when the originally positioned patterning slit sheet 150' sags due to self-gravity, the distance S' between the patterning slit sheet 150 that is sagging and the substrate 500 is greater than the distance S. In this case, the deposition material 115 discharged from the deposition source nozzles 121 is moved along a path v, passes through the sagging patterning slit sheet 150, and is finally deposited on the substrate 500, thereby forming an organic layer 150d. The organic layer 150d formed by using the patterning slit sheet 150 is shifted by a distance P in the Y-axis direction, compared to the organic layer 150d'. That is, a pattern shifting phenomenon occurs.

When the pattern shifting phenomenon occurs, organic layers 150c and organic layers 150b formed to the left and right of an organic layer 150a formed via a central patterning slit of the patterning slit sheet 150 that is sagging, bend toward both ends of the patterning slit sheet 150, which is caused by the patterning slit sheet 150 that is sagging, as illustrated in FIG. 10. Also, the farther a patterning slit 121 is located from the center of the patterning slit sheet 150, i.e., in an −X-axis direction or +X-axis direction, the greater an incident angle between the deposition source nozzle 121 and the patterning slit sheet 150. Thus, the distances between the organic layers 150c or 150b are increased. In order to prevent the original patterning slit sheet 150' from sagging, high tension may be applied when the original patterning slit sheet 150' is bound inside the frame 155. However, if the original patterning slit sheet 150' is large, it is difficult to completely prevent it from sagging due to self-gravity.

Figure 11:
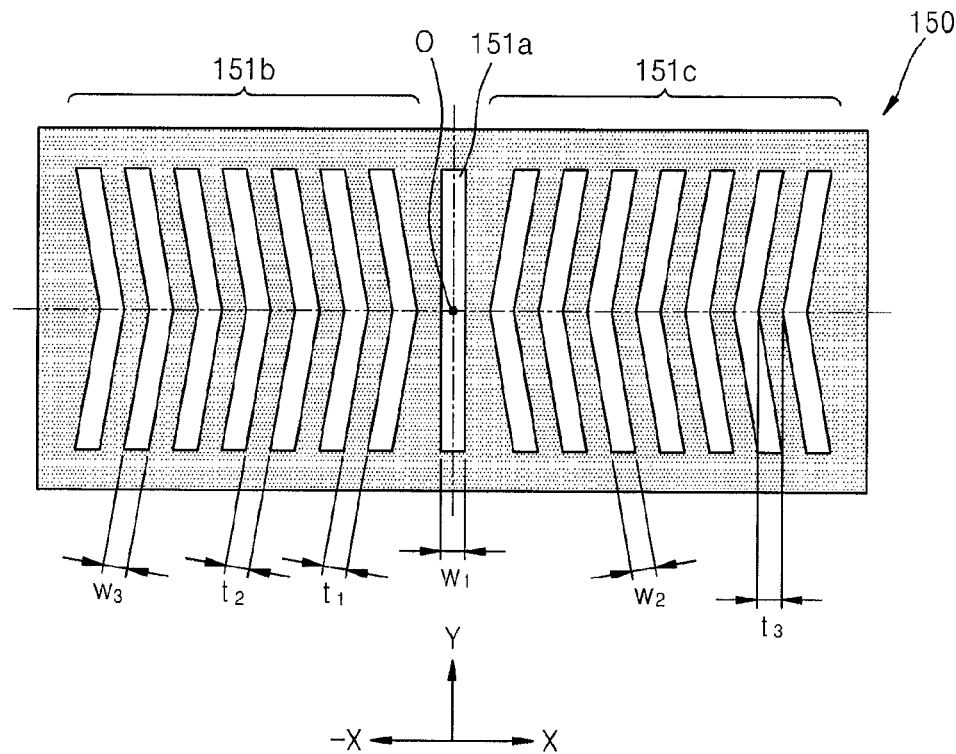
FIG. 11 is a plan view illustrating a modified example of a patterning slit sheet according to an embodiment of the present invention.

To solve this problem, in an organic layer deposition apparatus according to an embodiment of the present invention, the shapes of the patterning slits 151 of the patterning slit sheet 150 are modified, thereby compensating for the sagging of the patterning slit sheet 150. Referring to FIG. 11, a central patterning slit 151a, left patterning slits 151b, and right patterning slits 151c are formed in a patterning slit sheet 150. The left patterning slits 151b and the right patterning slits 151c bend toward the central patterning slit 151a. The shapes of the left patterning slits 151b and the right patterning slits 151c are opposite to those of the organic layers 150b and 150c illustrated in FIG. 10, respectively. In other words, FIG. 10 illustrates the organic layers 150a to 150c deposited via the patterning slit sheet 150, the patterning slits of which straighten when the patterning slit sheet 150 sags due to self-gravity. Referring to FIG. 10, the organic layers 150b and the organic layers 150c bend towards the both ends of the patterning slit sheet 150, i.e., the organic layers 150c in the X-axis direction and the organic layers 150b in the X-axis direction, with respect to the central organic layer 150a, respectively. In contrast, referring to FIG. 11, in the patterning slit sheet 150 of an organic layer deposition apparatus according to an embodiment of the present invention, the left patterning slits 151b and the right patterning slits 151c bend toward the central patterning slit 151a. When the shapes of the patterning slits 150b and 150c are modified as described above, it is possible to reduce or minimize the pattern shifting phenomenon which is caused when the patterning slit sheet 150 sags.

The central patterning slit 151a is formed at the center of the patterning slit sheet 150. A lengthwise direction of the central patterning slit 151a corresponds to the direction in which the deposition source nozzles 121 are arranged. Since the central patterning slit 151a is disposed directly above the deposition source nozzles 121, an organic layer formed via the central patterning slit 151a is not shifted.

The left patterning slits 151b are disposed to the left of the central patterning slit 151a, i.e., in the X-axis direction, and the right patterning slits 151c are disposed to the right of the central patterning slit 151a, i.e., in the X-axis direction.

The left patterning slits 151b may bend at centers thereof toward a midpoint O on the central patterning slit 151a, and the right patterning slits 151c may bend at centers thereof toward the midpoint O on the patterning slit 151a.

The distances t1 and t2 between adjacent left patterning slits 151b are the same, and the distances t3 between adjacent patterning slits 151c may also be the same.

The widths of the patterning slits 150a to 150c may be the same. Specifically, the widths w3 of the left patterning slits 151b may be the same, and the widths w2 of the right patterning slits 151c may also be the same. In addition, the widths w3 of the left patterning slits 151b may be the same as the widths w2 of the right patterning slits 151c. In addition, the width w1 of the central patterning slit 151a, the widths w3 of the left patterning slits 151b, and the widths w2 of the right patterning slits 151c may be the same.

Figure 12:
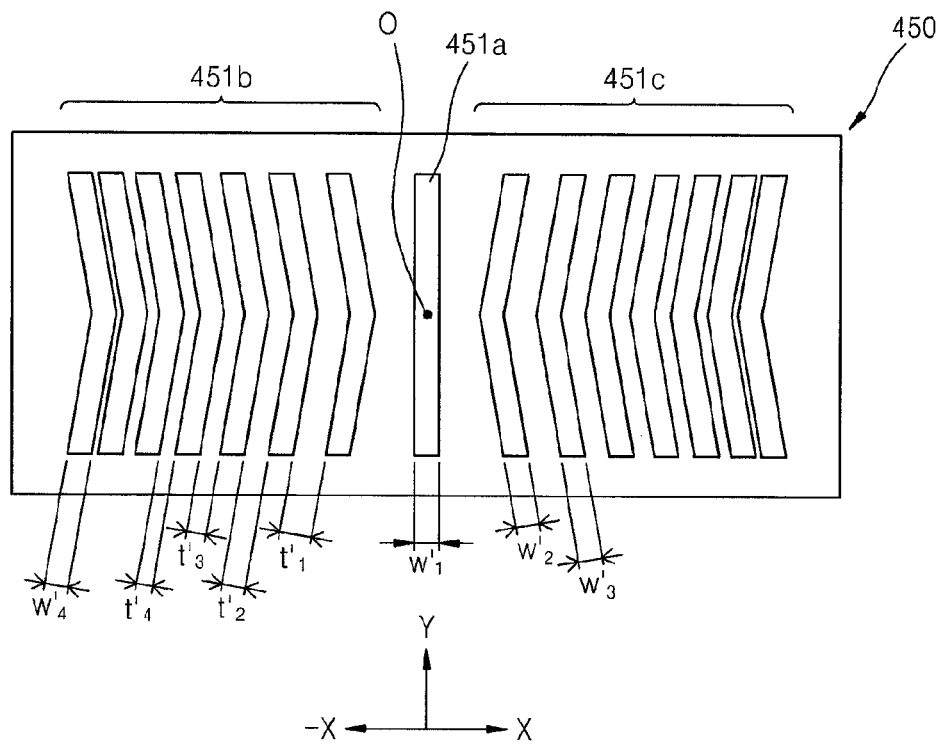
FIG. 12 is a plan view illustrating another modified example of a patterning slit sheet according to an embodiment of the present invention.

FIG. 12 is a plan view illustrating another modified example of a patterning slit sheet according to an embodiment of the present invention. Referring to FIG. 12, a central patterning slit 451a, left patterning slits 451b, and right patterning slits 451c may be formed in a patterning slit sheet 450. The left patterning slits 451b and the right patterning slits 451c may bend at centers thereof toward a midpoint O on the central patterning slit 451a.

The distances between adjacent left patterning slits 451b and the distances between adjacent right patterning slits 451c may not be the same. For example, the farther the left patterning slits 451b are located away from the central patterning slit 451a, the shorter the distances t'1, t'2, t'3, and t'4 between adjacent left patterning slits 451b may be. Also, the farther the right patterning slits 451c are located away from the central patterning slit 451a, the shorter the distances between adjacent right patterning slits 451c may be.

The widths of the patterning slits 451a, 451b, and 451c may be the same. Specifically, the widths w'4 of the left patterning slits 451b may be the same, and the widths w'2 and w'3 of the right patterning slits 451c may be the same. In addition, the widths w'4 of the left patterning slits 451b, the widths w'2 and w'3 of the right patterning slits 451c, and the width w'1 of the central patterning slit 451a may be the same.

Figure 13:
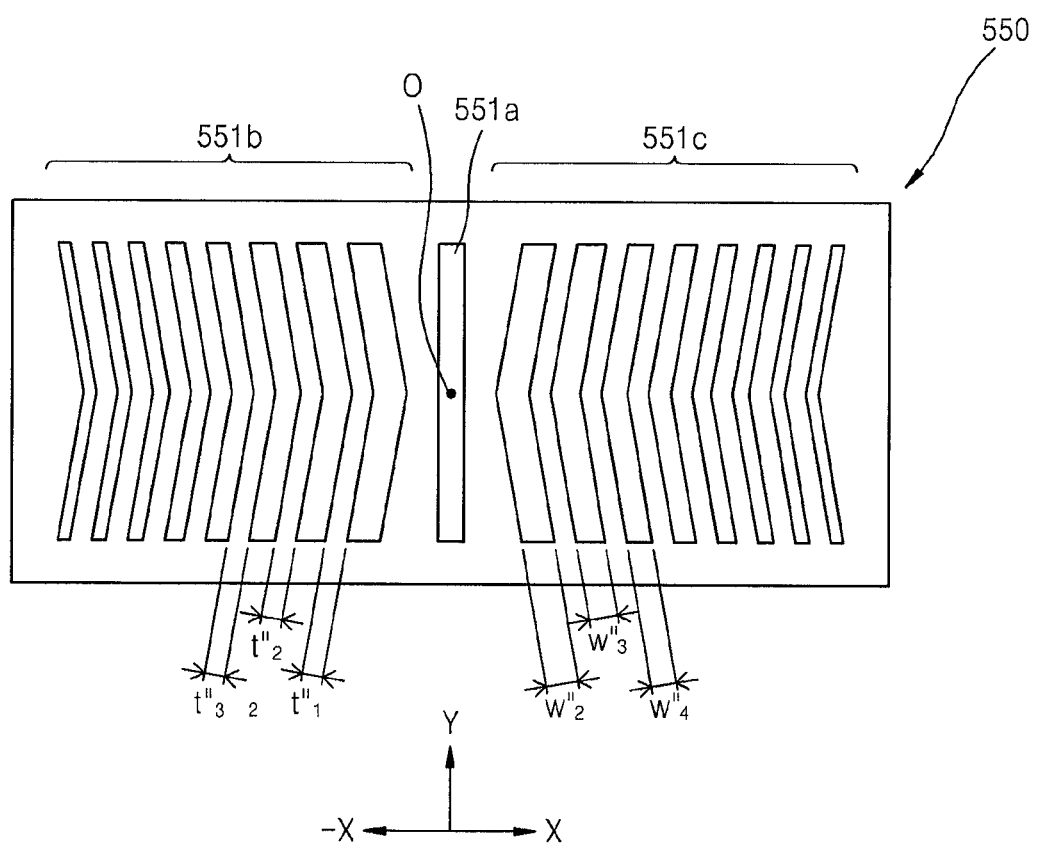
FIG. 13 is a plan view illustrating another modified example of a patterning slit sheet according to an embodiment of the present invention.

FIG. 13 is a plan view illustrating another modified example of a patterning slit sheet according to an embodiment of the present. Referring to FIG. 13, a central patterning slit 551a, left patterning slits 551b, and right patterning slits 551c may be formed in a patterning slit sheet 550. The left patterning slits 551b and the right patterning slits 551c may bend at centers thereof toward a midpoint O on the central patterning slit 551a.

The widths of the patterning slits 551b and 551c may not be the same. For example, the farther the right patterning slits 451c are located away from the central patterning slit 451a, the shorter the widths w"2, w"3, and w"4 of the right patterning slits 551c may be. Also, the farther the left patterning slits 551b are located away from the central patterning slit 551a, the shorter the widths of the left patterning slits 551b may be.

Distances t"1, t"2, and t"3 between adjacent left patterning slits 551b may be the same, and distances between adjacent right patterning slits 551c may be the same. Also, the distances t"1, t"2, and t"3 between adjacent left patterning slits 551b may be the same as the distances between adjacent right patterning slits 551c.

Figure 14:
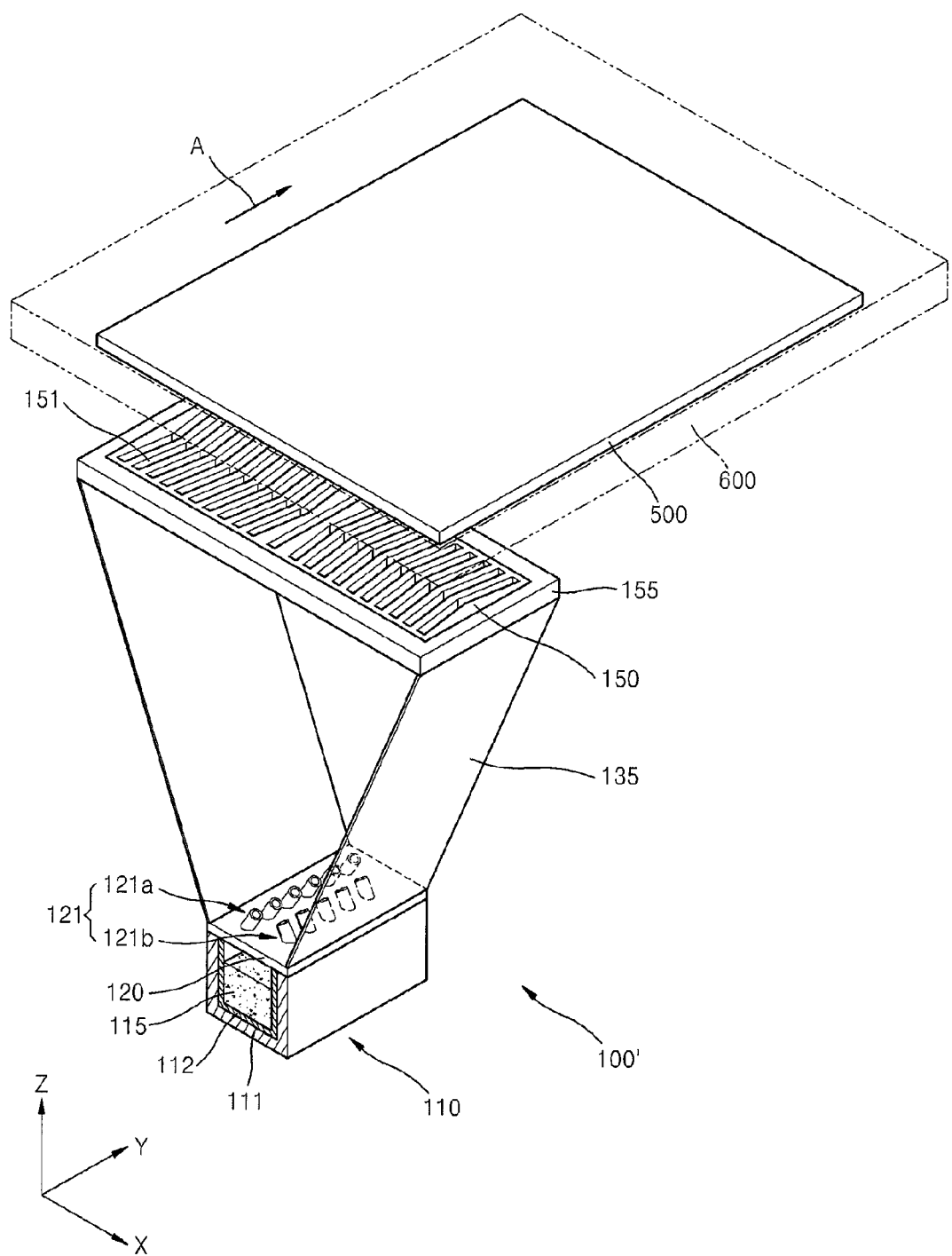
FIG. 14 is a schematic perspective view of an organic layer deposition apparatus according to another embodiment of the present invention.

FIG. 14 is a schematic perspective view of an organic layer deposition apparatus according to another embodiment of the present invention. Referring to FIG. 14, the organic layer deposition apparatus 100' includes a deposition source 110, a deposition source nozzle unit 120, and a patterning slit sheet 150. The deposition source 110 includes a crucible 112 filled with a deposition material 115, and a cooling block 111 that heats the crucible 112 to vaporize the deposition material 115 in the crucible 112 toward the deposition source nozzle unit 120. The deposition source nozzle unit 120, which has a planar shape, is disposed at a side of the deposition source 110. The deposition source nozzle unit 120 includes a plurality of deposition source nozzles 121 arranged in the Y-axis direction. The patterning slit sheet 150 and a frame 155 are further disposed between the deposition source 110 and a substrate 500. The patterning slit sheet 150 includes a plurality of patterning slits 151 arranged in the X-axis direction. The deposition source 110 and the deposition source nozzle unit 120 may be connected to the patterning slit sheet 150 by second connection members 133.

In the current embodiment, the plurality of deposition source nozzles 121 formed on the deposition source nozzle unit 120 are tilted at a set or predetermined angle, unlike the organic layer deposition apparatus 100 of FIG. 4. In particular, the deposition source nozzles 121 may include deposition source nozzles 121a and 121b arranged in respective rows. The deposition source nozzles 121a and 121b may be arranged in respective rows to alternate in a zigzag pattern. The deposition source nozzles 121a and 121b may be tilted by a set or predetermined angle with respect to an XY plane.

In the current embodiment, the deposition source nozzles 121a and 121b are arranged to tilt at a set or predetermined angle. The deposition source nozzles 121a in a first row and the deposition source nozzles 121b in a second row may tilt to face each other. That is, the deposition source nozzles 121a of the first row in a left part of the deposition source nozzle unit 120 may tilt to face a right side portion of the patterning slit sheet 150, and the deposition source nozzles 121b of the second row in a right part of the deposition source nozzle unit 120 may tilt to face a left side portion of the patterning slit sheet 150.

Accordingly, a deposition rate of the deposition material 115 may be adjusted to lessen the difference between thicknesses of thin films formed on center and end portions of the substrate 500, thereby improving thickness uniformity. Moreover, utilization efficiency of the deposition material 115 may also be improved.

Figure 15:
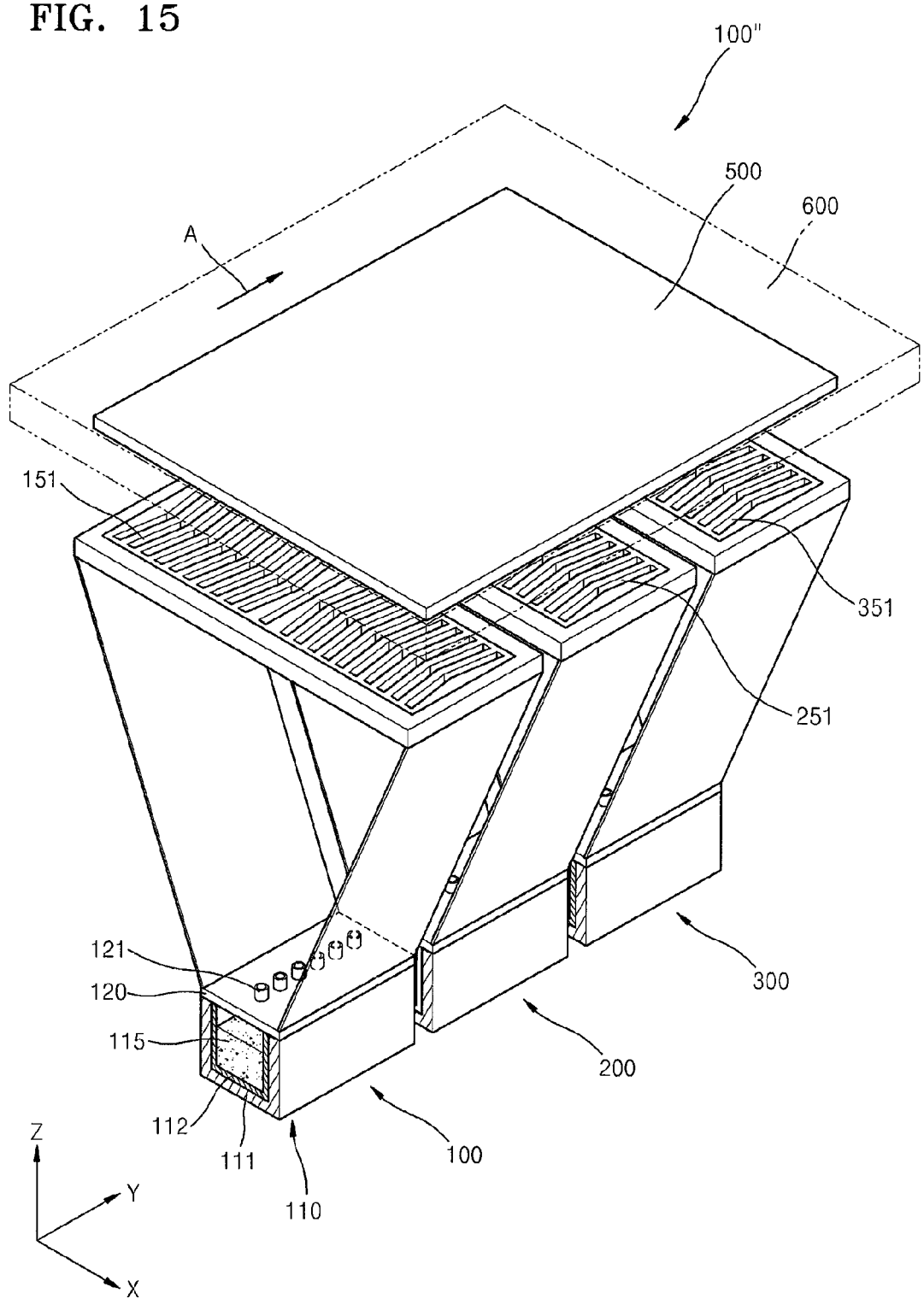
FIG. 15 is a schematic perspective view of an organic layer deposition apparatus according to another embodiment of the present invention.

FIG. 15 is a schematic perspective view of an organic layer deposition apparatus 100" according to another embodiment of the present invention. Referring to FIG. 15, the organic layer deposition apparatus according to the current embodiment may include a plurality of organic layer deposition apparatuses, each of which has the structure of the organic layer deposition apparatus 100 illustrated in FIGS. 4 to 6. In other words, the organic layer deposition apparatus 100" may include a multi-deposition source that simultaneously discharges deposition materials for forming a red (R) emission layer, a green (G) emission layer, and a blue (B) emission layer.

In particular, the organic layer deposition apparatus 100" according to the current embodiment includes a first organic layer deposition apparatus 100, a second organic layer deposition apparatus 200, and a third organic layer deposition apparatus 300. The first to third organic layer deposition apparatuses 100 to 300 have the same structure as the organic layer deposition apparatus 100 described with reference to FIGS. 4 through 6, and thus a detailed description thereof will not be provided here.

The deposition sources 110 of the first organic layer deposition apparatus 100, the second organic layer deposition apparatus 200, and the third organic layer deposition apparatus 300 may contain different deposition materials, respectively. For example, the first organic layer deposition apparatus 100 may contain a deposition material for forming a red (R) emission layer, the second organic layer deposition apparatus 200 may contain a deposition material for forming a green (G) emission layer, and the third organic layer deposition apparatus 300 may contain a deposition material for forming a blue (B) emission layer.

In other words, in a conventional method of manufacturing an organic light-emitting display device, a separate chamber and mask are generally used to form each color emission layer. However, when the organic layer deposition apparatus 100" according to the current embodiment is used, the R emission layer, the G emission layer, and the B emission layer may be formed at the same time with a single multi-deposition source. Thus, the time needed to manufacture an organic light-emitting display device is sharply reduced. In addition, the organic light-emitting display device may be manufactured with a reduced number of chambers, so that equipment costs are also markedly reduced.

In one embodiment, a patterning slit sheet of the first organic layer deposition apparatus 100, a patterning slit sheet of the second organic layer deposition apparatus 200, a patterning slit sheet of the third organic layer deposition apparatus 300 may be arranged to be offset by a constant distance with respect to each other, thereby protecting or preventing deposition regions corresponding to the patterning slit sheets from overlapping with one another on the substrate 500. In other words, if the first organic layer deposition apparatus 100, the second organic layer deposition apparatus 200, and the third organic layer deposition apparatus 300 are used to deposit the R emission layer, the G emission layer, and the B emission layer, respectively, then patterning slits 151 of the first organic layer deposition apparatus 100, patterning slits 251 of the second organic layer deposition apparatus 200, and patterning slits 351 of the third organic layer deposition apparatus 300 are arranged not to be aligned with respect to each other, thereby forming the R emission layer, the G emission layer, and the B emission layer in different regions of the substrate 500, respectively.

The deposition materials for forming the R emission layer, the G emission layer, and the B emission layer may be vaporized at different temperatures, respectively. Therefore, the temperatures of deposition sources of the respective first to third organic layer deposition apparatuses 100 to 300 may be set to be different.

Although the organic layer deposition apparatus 100" according to the current embodiment includes three organic layer deposition apparatuses 100 to 300, the present invention is not limited thereto. In other words, an organic layer deposition apparatus according to another embodiment of the present invention may include a plurality of organic layer deposition apparatuses, each of which contains a different deposition material. For example, an organic layer deposition apparatus according to another embodiment of the present invention may include five organic layer deposition apparatuses respectively containing materials for an R emission layer, a G emission layer, a B emission layer, an auxiliary R' layer of the R emission layer, and an auxiliary G' layer of the G emission layer.

As described above, a plurality of organic layers may be formed at the same time with a plurality of organic layer deposition apparatuses, and thus manufacturing yield and deposition efficiency are improved. In addition, the overall manufacturing process is simplified, and the manufacturing costs are reduced.

Figure 16:
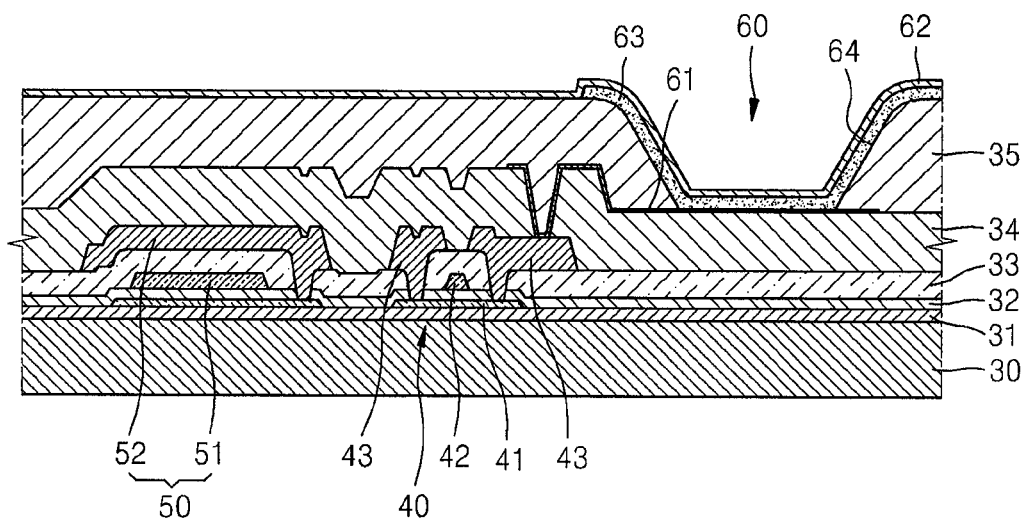
FIG. 16 is a cross-sectional view of an active matrix organic light-emitting display device fabricated by using an organic layer deposition apparatus according to an embodiment of the present invention.

FIG. 16 is a cross-sectional view of an active matrix organic light-emitting display device fabricated by using an organic layer deposition apparatus according to an embodiment of the present invention.

Referring to FIG. 16, the active matrix organic light-emitting display device is formed on a substrate 30. The substrate 30 may be formed of a transparent material, for example, glass, plastic, or metal. An insulating layer 31, such as a buffer layer, is formed on an entire surface of the substrate 30.

Referring to FIG. 16, a thin film transistor (TFT) 40, a capacitor 50 that includes first and second capacitor layers 51 and 52, and an organic light-emitting diode (OLED) 60 are disposed on the insulating layer 31.

An active layer 41 is formed in a set or predetermined pattern on the insulating layer 31. A gate insulating layer 32 is formed to cover the active layer 41. The active layer 41 may include a p-type or n-type semiconductor material.

A gate electrode 42 of the TFT 40 is formed in a region of the gate insulating layer 32 corresponding to the active layer 41. An interlayer insulating layer 33 is formed to cover the gate electrode 42. Then, the interlayer insulating layer 33 and the gate insulating layer 32 are etched by, for example, dry etching, to form a contact hole for exposing parts of the active layer 41.

A source/drain electrode 43 is formed on the interlayer insulating layer 33 to contact the active layer 41 exposed through the contact hole. A passivation layer 34 is formed to cover the source/drain electrode 43, and is etched to expose a part of the drain electrode 43. Another insulating layer may be further formed on the passivation layer 34 so as to planarize the passivation layer 34.

The OLED 60 displays set or predetermined image information by emitting red, green, or blue light as current flows therethrough. The OLED 60 includes a first electrode 61 disposed on the passivation layer 34. The first electrode 61 is electrically connected to the drain electrode 43 of the TFT 40.

A pixel defining layer 35 is formed to cover the first electrode 61. An opening 64 is formed in the pixel defining layer 35, and an organic emission layer 63 is formed in a region defined by the opening 64. A second electrode 62 is formed on the organic emission layer 63.

The pixel defining layer 35, which defines individual pixels, is formed of an organic material. The pixel defining layer 35 planarizes the surface of a region of the substrate 30 in which the first electrode 61 is formed, and in particular, the surface of the passivation layer 34.

The first electrode 61 and the second electrode 62 are insulated from each other, and respectively apply voltages of opposite polarities to the organic emission layer 63 to induce light emission.

The organic emission layer 63 may be formed of a low-molecular weight organic material or a high-molecular weight organic material. If the low-molecular weight organic material is used, then the organic emission layer 63 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), or the like. Such a low-molecular weight organic material may be deposited using vacuum deposition by using one of the organic layer deposition apparatus of FIG. 4.

After the opening 64 is formed in the pixel defining layer 35, the substrate 30 is transferred to a chamber, as illustrated in FIG. 1.

After the organic emission layer 63 is formed, the second electrode 62 may be formed by the same deposition method as used to form the organic emission layer 63.

The first electrode 61 may function as an anode, and the second electrode 62 may function as a cathode, or vice versa. The first electrode 61 may be patterned to correspond to individual pixel regions, and the second electrode 62 may be formed to cover all the pixels.

The first electrode 61 may be formed as a transparent electrode or a reflective electrode. The transparent electrode may be formed of an indium tin oxide (ITO), an indium zinc oxide (IZO), a zinc oxide (ZnO), or an indium oxide ($In_2O_3$). The reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and then forming a layer of an ITO, an IZO, a ZnO, or an $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 functions as a cathode. To this end, the transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic emission layer 63, and forming an auxiliary electrode layer or a bus electrode line thereon from ITO, IZO, ZnO, $In_2O_3$, or the like. When the second electrode layer 62 is formed as a reflective electrode, the reflective layer may be formed by depositing Li, Ca, LiF/Ca, LiF/Al, Al, Ag, Mg, or a compound thereof on the organic emission layer 63. The second electrode 62 may be formed by using the same deposition method as used to form the organic emission layer 63 described above.

The organic layer deposition apparatuses according to the above embodiments of the present invention may be applied to form an organic layer or an inorganic layer of an organic TFT, and to form layers from various suitable materials.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method for forming an organic layer on a substrate by an organic layer deposition apparatus comprising a deposition source, a deposition source nozzle unit, and a patterning slit sheet, the method comprising:
    disposing the deposition source nozzle unit at a side of the deposition source, the deposition source nozzle unit comprising a plurality of deposition source nozzles arranged in a first direction;
    disposing the patterning slit sheet to face the deposition source nozzle unit, the patterning slit sheet having a plurality of patterning slits arranged in a second direction perpendicular to the first direction;
    discharging a deposition material by the deposition source and through the deposition source nozzle unit and the patterning slit sheet to form the organic layer on the substrate,
    wherein the plurality of patterning slits comprise:
    a central patterning slit at a center of the patterning slit sheet;
    a plurality of left patterning slits disposed to a left of the central patterning slit; and
    a plurality of right patterning slits disposed to a right of the central patterning slit,
    wherein, when the patterning slit sheet is planar and rectangular in shape, the plurality of left patterning slits and the plurality of right patterning slits bend toward the central patterning slit.

2. The method of claim 1, wherein a lengthwise direction of the central patterning slit is parallel with the first direction.

3. The method of claim 1, wherein the plurality of left patterning slits and the plurality of right patterning slits bend toward a midpoint on the central patterning slit.

4. The method of claim 1, wherein widths of the plurality of patterning slits are the same.

5. The method of claim 1, wherein distances between adjacent left patterning slits are the same.

6. The method of claim 1, wherein distances between adjacent right patterning slits are the same.

7. The method of claim 1, wherein distances between adjacent patterning slits are not the same.

8. The method of claim 7, wherein the farther the plurality of left patterning slits are located away from the central patterning slit, the shorter the distances between adjacent left patterning slits.

9. The method of claim 7, wherein the farther the plurality of right patterning slits are located away from the central patterning slit, the shorter the distances between adjacent right patterning slits.

10. The method of claim 7, wherein widths of the plurality of patterning slits are the same.

11. The method of claim 1, wherein widths of the plurality of patterning slits are not the same.

12. The method of claim 11, wherein the farther the plurality of left patterning slits are located away from the central patterning slit, the less the widths of the plurality of left patterning slits.

13. The method of claim 11, wherein the farther the plurality of right patterning slits are located away from the central patterning slit, the less the widths of the plurality of right patterning slits.

14. The method of claim 11, wherein distances between adjacent left patterning slits are the same.

15. The method of claim 11, wherein distances between adjacent right patterning slits are the same.

16. The method of claim 1, wherein the deposition source, the deposition source nozzle unit, and the patterning slit sheet are integrated as one body.

17. The method of claim 1, wherein the deposition source, the deposition source nozzle unit, and the patterning slit sheet are integrated as one body via connection members configured to guide movement of the deposition material.

18. The method of claim 17, wherein the connection members are formed to seal a space between the deposition source, the deposition source nozzle unit, and the patterning slit sheet.

19. The method of claim 1, wherein the plurality of deposition source nozzles are tilted at a set angle.

20. The method of claim 19, wherein the plurality of deposition source nozzles comprise deposition source nozzles arranged in two rows in the first direction, wherein the deposition source nozzles in the two rows are tilted to face each other.

21. The method of claim 19, wherein the plurality of deposition source nozzles comprise deposition source nozzles arranged in first and second rows in the first direction,
wherein the deposition source nozzles of the first row located to overlap a left side of the patterning slit sheet are arranged to face a right side of the patterning slit sheet, and
the deposition source nozzles of the second row located to overlap the right side of the patterning slit sheet are arranged to face the left side of the patterning slit sheet.

22. The method of claim 1, wherein the central patterning slit extends along a direction to correspond to the first direction in which the plurality of deposition source nozzles are arranged.

23. The method of claim 1, wherein the patterning slit sheet sags toward the deposition source.

* * * * *